US012804948B2

(12) United States Patent
Kang et al.

(10) Patent No.: US 12,804,948 B2
(45) Date of Patent: Nov. 17, 2026

(54) EXTRA GATE DEVICE INTEGRATION WITH SEMICONDUCTOR DEVICE

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 18/528,207

(22) Filed: Dec. 4, 2023

(65) Prior Publication Data

US 2025/0185292 A1 Jun. 5, 2025

(51) Int. Cl.
*H10D 30/67* (2025.01)
*H10D 30/01* (2025.01)
(Continued)

(52) U.S. Cl.
CPC ....... *H10D 30/6729* (2025.01); *H10D 30/014* (2025.01); *H10D 30/43* (2025.01);
(Continued)

(58) Field of Classification Search
CPC ............. H10D 84/017; H10D 84/0172; H10D 84/0179; H10D 84/0186; H10D 84/8311; H10D 84/83125; H10D 84/83138; H10D 84/832; H10D 84/834; H10D 84/853; H10D 84/856; H10D 30/6729; H10D 30/014; H10D 30/43; H10D 30/6735; H10D 30/6757; H10D 62/121; H10D 89/00; H10D 30/0198; H10D 64/251; H10D 64/017; H10D 84/0135; H10D 84/0128; H10D 84/013; H10D 84/0144; H10D 84/0149; H10D 84/8312; H10D 30/501; H10D 84/8314; H10D 84/0167; H10D 84/0181;
(Continued)

(56) References Cited

U.S. PATENT DOCUMENTS 6,821,858 B2 * 11/2004 Namatame ........... H10D 30/608 257/E29.267
6,891,235 B1 * 5/2005 Furukawa .......... H10D 30/0227 257/E29.054
(Continued)

FOREIGN PATENT DOCUMENTS

| | | | |
|---|---|---|---|
| EP | 4202996 | A2 | 6/2023 |
| KR | 2026-0020482 | A | 2/2026 |
| WO | 2025/119555 | A1 | 6/2025 |

OTHER PUBLICATIONS

L. Peters, "Challenges In Backside Power Delivery," https://semiengineering.com/challenges-in-backside-power-delivery/, Nov. 17, 2022, 19 pages.
(Continued)

*Primary Examiner* — Eduardo A Rodela
(74) *Attorney, Agent, or Firm* — Samuel Waldbaum; Ryan, Mason & Lewis, LLP

(57) ABSTRACT

A semiconductor structure includes a first backside source/drain region and a second backside source/drain region in a substrate, associated with an extra gate device, disposed within a backside region of the semiconductor structure.

19 Claims, 21 Drawing Sheets

(51) Int. Cl.
*H10D 30/43* (2025.01)
*H10D 62/10* (2025.01)
*H10D 89/00* (2025.01)

(52) U.S. Cl.
CPC ..... *H10D 30/6735* (2025.01); *H10D 30/6757* (2025.01); *H10D 62/121* (2025.01); *H10D 89/00* (2025.01)

(58) Field of Classification Search
CPC ... H10D 84/851; B82Y 10/00; H10W 20/427; H10W 20/069; H10W 20/0696; H10W 20/481
See application file for complete search history.

(56) References Cited

U.S. PATENT DOCUMENTS

| | | | | |
|---|---|---|---|---|
| 8,373,228 | B2 * | 2/2013 | Yang | H10D 86/01 438/666 |
| 9,755,029 | B1 * | 9/2017 | Goktepeli | H01R 13/6599 |
| 9,818,650 | B2 | 11/2017 | Doris et al. | |
| 9,947,593 | B2 | 4/2018 | Doris et al. | |
| 10,886,217 | B2 * | 1/2021 | Morrow | H10W 20/40 |
| 11,282,839 | B2 * | 3/2022 | Kim | H10D 84/85 |
| 11,437,379 | B2 | 9/2022 | Song et al. | |
| 11,444,166 | B2 | 9/2022 | Glass et al. | |
| 11,688,780 | B2 | 6/2023 | Mehandru et al. | |
| 11,705,515 | B2 | 7/2023 | Yang et al. | |
| 2003/0122187 | A1 * | 7/2003 | Yoo | H10D 30/025 257/329 |
| 2003/0207543 | A1 * | 11/2003 | Salling | H10P 30/204 257/E21.336 |
| 2006/0115943 | A1 * | 6/2006 | Koyanagi | H10D 86/01 257/E29.295 |
| 2007/0296002 | A1 * | 12/2007 | Liang | H10D 30/60 257/288 |
| 2013/0221433 | A1 * | 8/2013 | Molin | H10D 84/641 438/156 |
| 2015/0041887 | A1 * | 2/2015 | Soeno | H10D 30/668 257/330 |
| 2015/0061020 | A1 * | 3/2015 | Yokoyama | H10B 61/22 438/666 |
| 2016/0095221 | A1 | 3/2016 | Ramachandran et al. | |
| 2018/0061766 | A1 | 3/2018 | Goktepeli | |
| 2019/0097592 | A1 | 3/2019 | Goktepeli | |
| 2020/0373242 | A1 | 11/2020 | Hiblot et al. | |
| 2020/0411665 | A1 | 12/2020 | Hafez et al. | |
| 2022/0270924 | A1 | 8/2022 | La Tulipe et al. | |
| 2023/0012147 | A1 | 1/2023 | Chu et al. | |
| 2023/0275084 | A1 | 8/2023 | Hong et al. | |

OTHER PUBLICATIONS

International Searching Authority, "Notification of Transmittal of the International Search Report and the Written Opinion of the International Searching Authority, or Declaration," Patent Cooperation Treaty, Mar. 10, 2025, 25 pages, International Application No. PCT/ EP2024/080921.

Intellectual Property Office, "Request for the Submission of an Opinion," May 28, 2026, 12 Pages, KR Application No. 10-2026-7000738.

* cited by examiner

EXTRA GATE DEVICE INTEGRATION WITH SEMICONDUCTOR DEVICE

BACKGROUND

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

Illustrative embodiments of the present application include techniques for use in semiconductor manufacture. In an illustrative embodiment, a semiconductor structure comprises a first backside source/drain region and a second backside source/drain region in a substrate, associated with an extra gate device, disposed within a backside region of the semiconductor structure.

The semiconductor structure of the illustrative embodiment advantageously has an extra gate device in a backside region of the semiconductor structure and a logic device region having nanosheet channel layers in a frontside of the semiconductor structure. In addition, since extra gate devices take up a lot of space on a semiconductor structure, forming an extra gate device on a backside of the semiconductor structure provides area reduction.

In one or more additional illustrative embodiments, as may be combined with the preceding paragraphs, the semiconductor structure further comprises a first backside source/drain contact connecting the first backside source/drain region to a backside power delivery network, and a second backside source/drain contact connecting the second backside source/drain region to the backside power delivery network.

In one or more additional illustrative embodiments, as may be combined with the preceding paragraphs, the first backside source/drain region and the second backside source/drain region comprise an ion-implanted first backside source/drain region and an ion-implanted second backside source/drain region.

In one or more additional illustrative embodiments, as may be combined with the preceding paragraphs, the first backside source/drain region and the second backside source/drain region in the substrate is a planar device.

In one or more additional illustrative embodiments, as may be combined with the preceding paragraphs, the extra gate device is co-integrated with a logic device.

In one or more additional illustrative embodiments, as may be combined with the preceding paragraphs, the extra gate device is co-integrated with a logic device, where the logic device comprises a frontside source/drain region connected to the backside power delivery network by a third backside source/drain contact.

In one or more additional illustrative embodiments, as may be combined with the preceding paragraphs, the logic device further comprises a plurality of nanosheet channel layers disposed on opposite sidewalls of the frontside source/drain region.

According to another exemplary embodiment, a semiconductor structure comprises a gate extension extending from a gate region, associated with an extra gate device, within a frontside of the semiconductor structure. The gate extension is disposed between opposing sidewalls of a first shallow trench region and a second shallow trench region disposed on a substrate. A gate dielectric layer is disposed between the gate extension and a top surface of the substrate.

The semiconductor structure of the illustrative embodiment advantageously has an extra gate device in a backside region of the semiconductor structure and a logic device region having nanosheet channel layers in a frontside of the semiconductor structure. In addition, the extra gate device further has a metal gate with a gate extension in the frontside with a gate dielectric layer disposed between the gate extension and a channel on the backside of the semiconductor structure. In addition, since extra gate devices take up a lot of space on a semiconductor structure, forming an extra gate device on a backside of the semiconductor structure provides area reduction.

In one or more additional illustrative embodiments, as may be combined with the preceding paragraphs, the semiconductor structure further comprises a middle-of-the-line contact connecting the gate region to a back-end-of-the-line interconnect.

In one or more additional illustrative embodiments, as may be combined with the preceding paragraphs, the gate region and the gate extension comprise a same conductive material.

In one or more additional illustrative embodiments, as may be combined with the preceding paragraphs, the gate dielectric layer is further disposed between the gate extension and the first shallow trench region and the second shallow trench region and on a portion of the top surfaces of the first shallow trench region and the second shallow trench region under the gate region.

In one or more additional illustrative embodiments, as may be combined with the preceding paragraphs, the semiconductor structure further comprises a first backside source/drain region and a second backside source/drain region in the substrate, associated with the extra gate device, disposed within a backside region of the semiconductor structure.

In one or more additional illustrative embodiments, as may be combined with the preceding paragraphs, the semiconductor structure further comprises a first backside source/drain contact connecting the first backside source/drain region to a backside power delivery network, and a second backside source/drain contact connecting the second backside source/drain region to the backside power delivery network.

In one or more additional illustrative embodiments, as may be combined with the preceding paragraphs, the first backside source/drain region and the second backside source/drain region comprise an ion-implanted first backside source/drain region and an ion-implanted second backside source/drain region.

In one or more additional illustrative embodiments, as may be combined with the preceding paragraphs, the extra gate device is co-integrated with a logic device, the logic device being in the frontside region of the semiconductor structure and comprising a frontside source/drain region connected to a backside power delivery network by a backside source/drain contact.

In a further exemplary embodiment, a semiconductor structure comprises an extra gate device disposed within a backside region of the semiconductor structure, and comprising a first ion-implanted backside source/drain region and a second ion-implanted backside source/drain region within a substrate, and a logic device, disposed within a frontside region of the semiconductor structure and comprising a first stack of nanosheet channel layers and a second stack of nanosheet channel layers adjacent to the first stack of nanosheet channel layers, and an epitaxial grown source/drain region between the first stack of nanosheet channel layers and the second stack of nanosheet channel layers. The extra gate device is co-integrated with the logic device.

The semiconductor structure of the illustrative embodiment advantageously has an extra gate device in a backside region of the semiconductor structure and a logic device region having nanosheet channel layers in a frontside of the semiconductor structure. In addition, the extra gate device further has a metal gate with a gate extension in the frontside with a gate dielectric layer disposed between the gate extension and a channel on the backside of the semiconductor structure. In addition, since extra gate devices take up a lot of space on a semiconductor structure, forming an extra gate device on a backside of the semiconductor structure provides area reduction.

In one or more additional illustrative embodiments, as may be combined with the preceding paragraphs, a top surface of each of the first ion-implanted backside source/drain region and the second ion-implanted backside source/drain region is coplanar with a top surface of the substrate, and wherein a top surface of the epitaxial grown source/drain region is above a top surface of each of the first stack of nanosheet channel layers and the second stack of nanosheet channel layers.

In one or more additional illustrative embodiments, as may be combined with the preceding paragraphs, the semiconductor structure further comprises a first backside source/drain contact connecting the first ion-implanted backside source/drain region to a backside power delivery network, and a second backside source/drain contact connecting the second ion-implanted backside source/drain region to the backside power delivery network.

In one or more additional illustrative embodiments, as may be combined with the preceding paragraphs, the epitaxial grown source/drain region is connected to the backside power delivery network by a third backside source/drain contact.

Another exemplary embodiment comprises an integrated circuit comprising one or more semiconductor structures. At least one of the one or more semiconductor structures is a semiconductor structure according to one or more of the foregoing illustrative embodiments.

The integrated circuit of the illustrative embodiment advantageously allows for the semiconductor structure having an extra gate device in a backside region of the semiconductor structure and a logic device region having nanosheet channel layers in a frontside of the semiconductor structure. In addition, the extra gate device further has a metal gate with a gate extension in the frontside with a gate dielectric layer disposed between the gate extension and a channel on the backside of the semiconductor structure. In addition, since extra gate devices take up a lot of space on a semiconductor structure, forming an extra gate device on a backside of the semiconductor structure provides area reduction.

In a further exemplary embodiment, a method comprises ion implanting a first backside source/drain region and a second backside source/drain region in a substrate, associated with an extra gate device, disposed within a backside region of a semiconductor structure.

The method of the illustrative embodiment advantageously allows for formation of semiconductor structure having an extra gate device in a backside region of the semiconductor structure and a logic device region having nanosheet channel layers in a frontside of the semiconductor structure. In addition, the extra gate device further has a metal gate with a gate extension in the frontside with a gate dielectric layer disposed between the gate extension and a channel on the backside of the semiconductor structure. In addition, since extra gate devices take up a lot of space on a semiconductor structure, forming an extra gate device on a backside of the semiconductor structure provides area reduction.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1A:
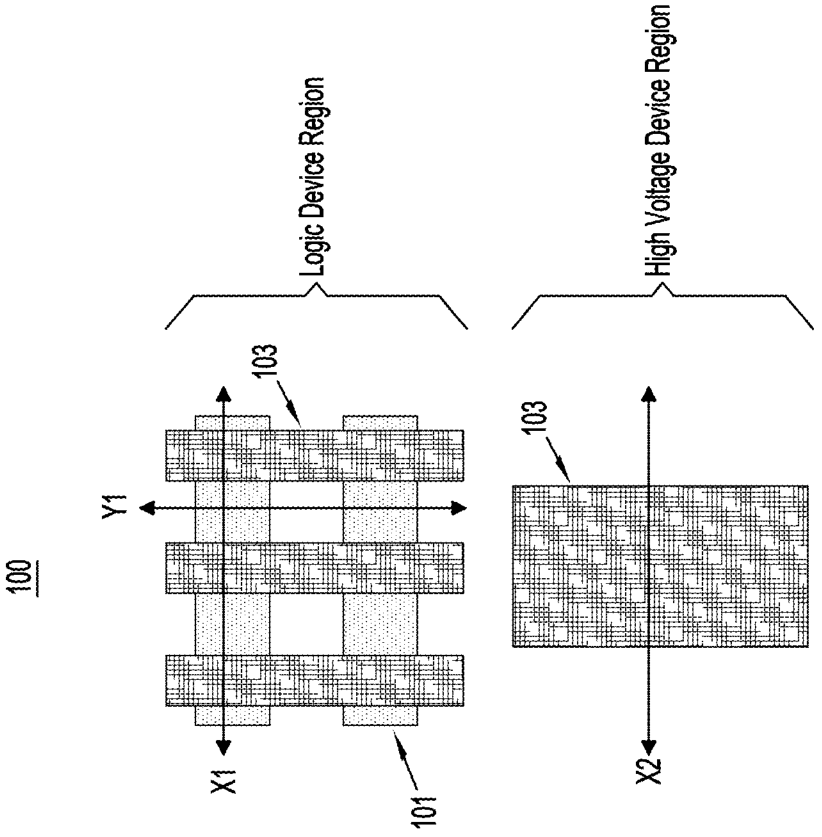
FIG. 1A is a top-down view of a logic device region and a high voltage device region of a semiconductor structure at an intermediate step of a method of fabricating a nanosheet transistor structure according to an embodiment of the invention.

This disclosure relates generally to semiconductor devices, and more particularly to semiconductor structures having a logic device region and a high voltage device region co-integrated with a backside power delivery network, and methods for their fabrication. However, it is to be understood that embodiments of the present disclosure are not limited to the illustrative methods, apparatus, systems and devices but instead are more broadly applicable to other suitable methods, apparatus, systems and devices.

High voltage devices for input/output (I/O) circuits (referred to as an “extra gate device,” or “EG device”) require supernormal gate dielectrics as compared to single gate (SG) devices which are employed in logic devices used for logic circuits. For example, extra gate devices and single gate devices are integrated together in a complementary metal oxide semiconductor (CMOS) device.

Extra gate device integration is challenging for nanosheet technology. For example, forming an extra gate device on a nanosheet requires a large sheet-to-sheet spacing (i.e., Tsus) to accommodate a thick gate dielectric. Higher voltage devices for input/output circuits require thicker gate dielectrics as compared to standard gate devices, which have a lower voltage and may be employed, e.g., in logic devices. However, spacing between sheets needs to be small to realize capacitance benefits. In addition, forming a single gate device (logic device) and an extra gate device (high voltage device) both in the frontside of a semiconductor structure is not desirable as it requires many more masking steps. Thus, there is a need for a new device structure and method to build the structure to enable the integration of high voltage or extra gate devices with standard nanosheet devices.

Accordingly, the illustrative embodiments of the present disclosure overcome the foregoing drawbacks by forming a logic device region having nanosheet channel layers in a frontside of a substrate and a high voltage device region in a backside of the substrate thereby saving on a number of the required masking steps. Moreover, since the high voltage devices also take up a lot of space on the semiconductor structure, forming them on backside can provide some area reduction. The increased gate dielectric thickness needed for high voltage devices is thicker than the optimal space between sheets.

Detailed embodiments of the semiconductor structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

It is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the interest of not obscuring the presentation of the embodiments of the present disclosure, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present disclosure, description of previously discussed materials, processes, and structures may not be repeated with regard to subsequent FIGURES. In other instances, some processing steps or operations that are known may not be described. It should be understood that the following description is rather focused on the distinctive features or elements of the various embodiments of the present invention.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include, but are not limited to, physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The patterns created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Referring now to the drawings in which like numerals represent the same of similar elements, FIGS. 1A-20C illustrate various processes for fabricating semiconductor structures with logic device region and high voltage device region structures. Note that the same reference numeral (100) is used to denote the semiconductor structure through the various intermediate fabrication stages illustrated in FIGS. 1A-20C. Note also that the semiconductor structures described herein can also be considered to be a semiconductor device and/or an integrated circuit, or some part thereof. For the purpose of clarity, some fabrication steps leading up to the production of the semiconductor structures as illustrated in FIGS. 1A-20C are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1D:
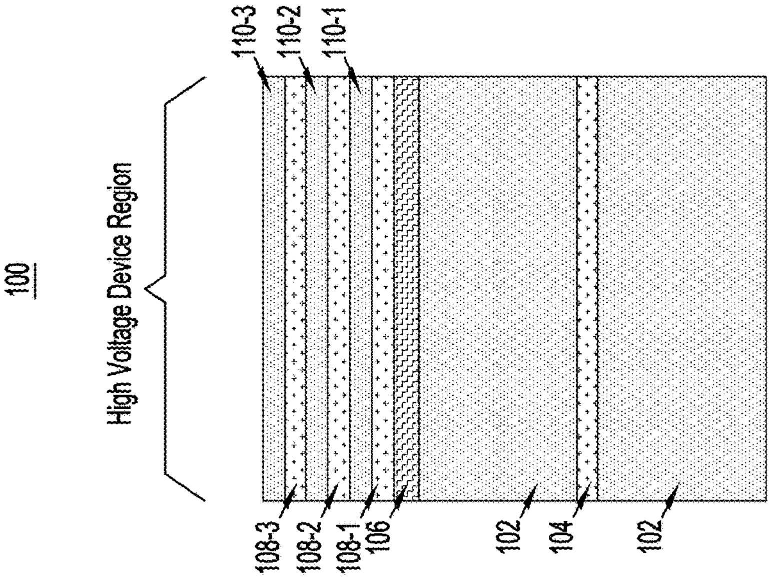
FIG. 1D is a cross-sectional view of the semiconductor structure showing the high voltage device region taken along the X2-X2 axis of FIG. 1A, according to an illustrative embodiment.
Figure 1C:
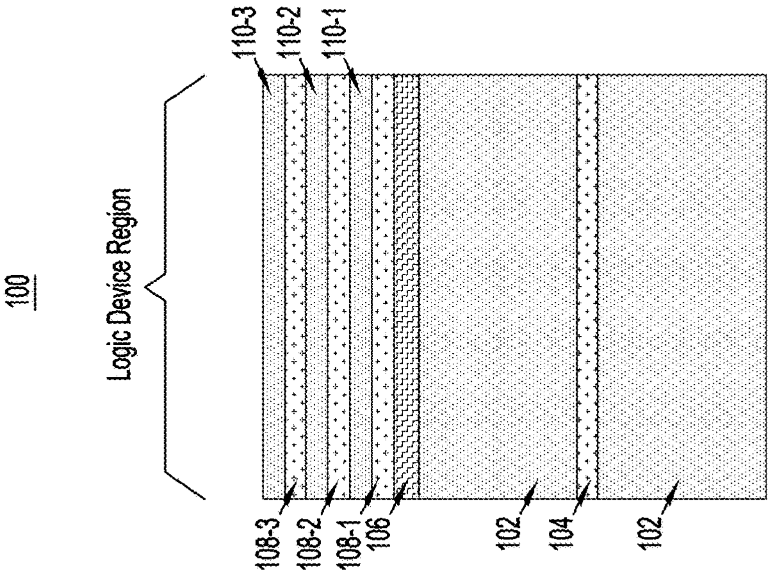
FIG. 1C is a cross-sectional view of the semiconductor structure showing the logic device region taken along the Y1-Y1 axis of FIG. 1A, according to an illustrative embodiment.
Figure 1B:
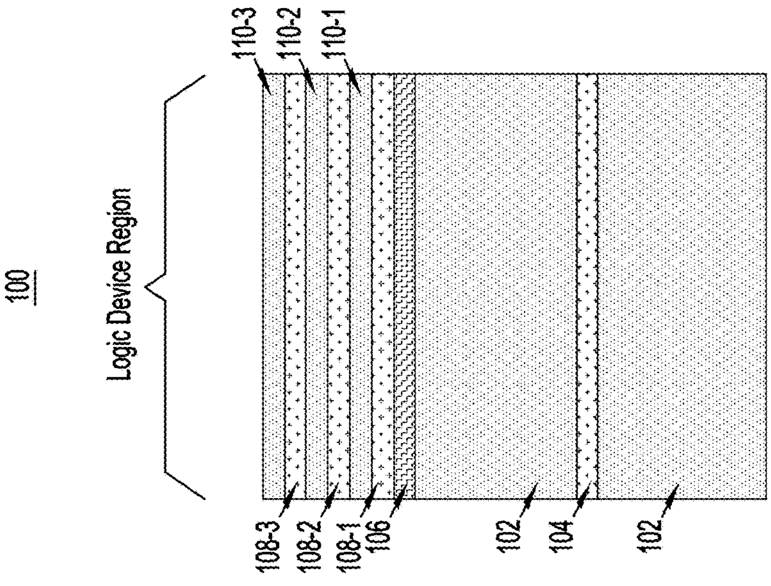
FIG. 1B is a cross-sectional view of the semiconductor structure showing the logic device region taken along the X1-X1 axis of FIG. 1A, according to an illustrative embodiment.

Referring now to FIGS. 1A-1D, FIG. 1A shows a top-down view of illustrating where the cross-sectional views are taken in a logic device region and a high voltage device region of a semiconductor structure 100. FIG. 1A shows a fin active region 101 for the logic device region, along with gate regions 103 for the logic device region and the high voltage device region. FIGS. 1B and 1C show a cross-sectional view of the logic device region taken along the lines at the X1-X1 axis and the Y1-Y1 axis in the top-down view of FIG. 1A. FIG. 1D shows a cross-sectional view of the high voltage device region taken along the line at the X2-X2 axis in the top-down view of FIG. 1A.

Referring now to FIGS. 1B-1D, the semiconductor structure 100 is shown during an intermediate step of a method of fabricating a nanosheet transistor structure according to an embodiment of the invention. The semiconductor structure 100 includes a substrate 102. The substrate 102 may be formed of any suitable semiconductor material, including various silicon-containing materials including, but not limited to, silicon (Si), silicon germanium (SiGe), silicon germanium carbide (SiGeC), silicon carbide (SiC) and multilayers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

An etch stop layer 104 is formed in the substrate 102. The etch stop layer 104 may comprise a buried oxide (BOX) layer or silicon germanium (SiGe), or another suitable material such as a III-V semiconductor epitaxial layer.

Nanosheets are initially formed over the substrate 102, where the nanosheets include a sacrificial layer 106, sacrificial layers 108-1, 108-2 and 108-3 (collectively, the sacrificial layers 108), and nanosheet channel layers 110-1, 110-2 and 110-3 (collectively, the nanosheet channel layers 110). The sacrificial layers 106 and 108 are illustratively formed of different sacrificial materials, such that they may be etched or otherwise removed selective to one another. In some embodiments, the sacrificial layers 106 and 108 are formed of SiGe, but with different percentages of Ge. For example, certain ones of the sacrificial layers 106 and 108 may have a relatively higher percentage of Ge (e.g., 55% Ge), and other ones of the sacrificial layers 106 and 108 may have a relatively lower percentage of Ge (e.g., 33% Ge or 25% Ge). In some embodiments, sacrificial layer 106 has a relatively higher percentage of Ge (e.g., 55% Ge), and the other sacrificial layers 108 have a relatively lower percentage of Ge (e.g., 33% Ge). Other combinations of different sacrificial materials may be used in other embodiments. The nanosheet channel layers 110 may be formed of Si or another suitable material (e.g., a material similar to that used for the substrate 102).

Figure 2A:
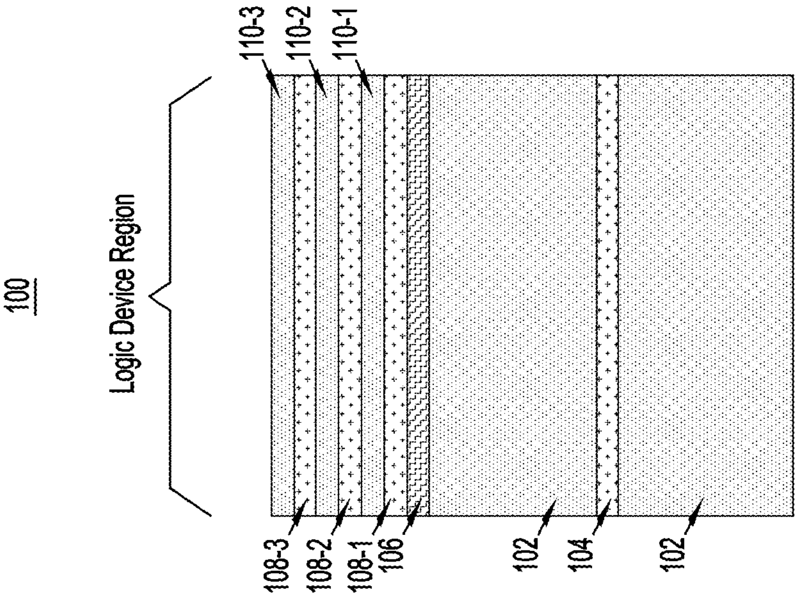
FIG. 2A is a cross-sectional view of the semiconductor structure showing the logic device region taken along the X1-X1 axis of FIG. 1A following patterning of the sacrificial layer, the sacrificial layers and the nanosheet channel layers, according to an illustrative embodiment.
Figure 2B:
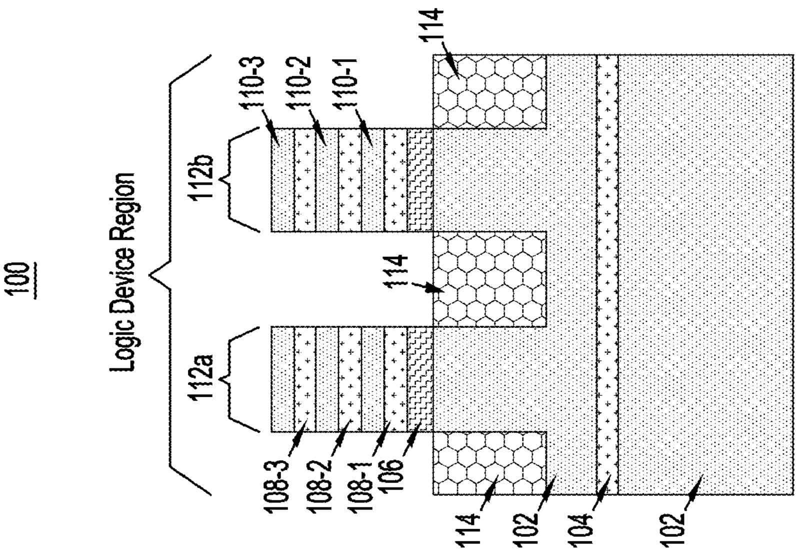
FIG. 2B is a cross-sectional view of the semiconductor structure showing the logic device region taken along the Y1-Y1 axis of FIG. 1A following patterning of the sacrificial layer, the sacrificial layers and the nanosheet channel layers, according to an illustrative embodiment.
Figure 2C:
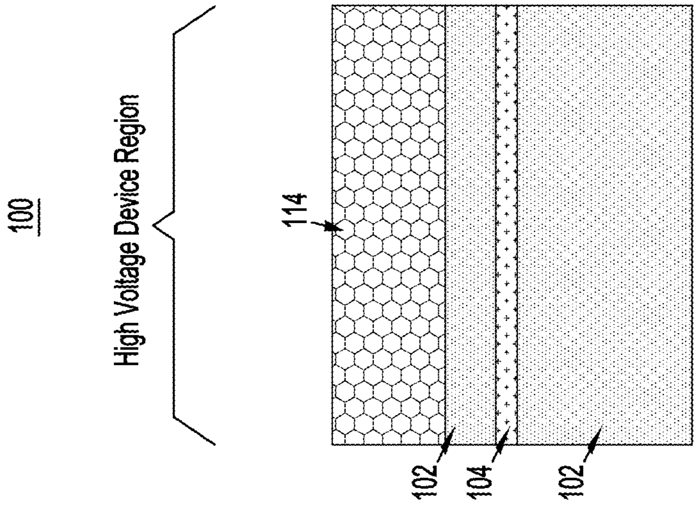
FIG. 2C is a cross-sectional view of the semiconductor structure showing the high voltage device region taken along the X2-X2 axis of FIG. 1A following patterning of the sacrificial layer, the sacrificial layers and the nanosheet channel layers, according to an illustrative embodiment.

Referring now to FIGS. 2A-2C, the semiconductor structure 100 is shown following patterning of the sacrificial layer 106, the sacrificial layers 108 and the nanosheet channel layers 110 according to an embodiment of the invention. For example, the sacrificial layer 106, the sacrificial layers 108 and the nanosheet channel layers 110 are patterned using known lithographic, patterning and etching processes to form field-effect transistor (FET) stacks 112*a* and 112*b* as shown in FIG. 2B, and shallow trench isolation (STI) regions 114 in FIGS. 2B and 2C. The STI regions 114 may be formed of a dielectric material such as silicon dioxide ($SiO_2$), silicon oxycarbide (SiOC), silicon oxynitride (SiON), etc. and are formed by methods known in the art. For example, in one illustrative embodiment, the STI regions 114 are a shallow trench isolation oxide layer. Each of the FET stacks 112*a* and 112*b* contain a FET device. The FET devices may comprise an nFET device or a pFET device for one FET device and the other FET device may comprise a pFET device or an nFET device.

Figures 3A, 3B, 3C:
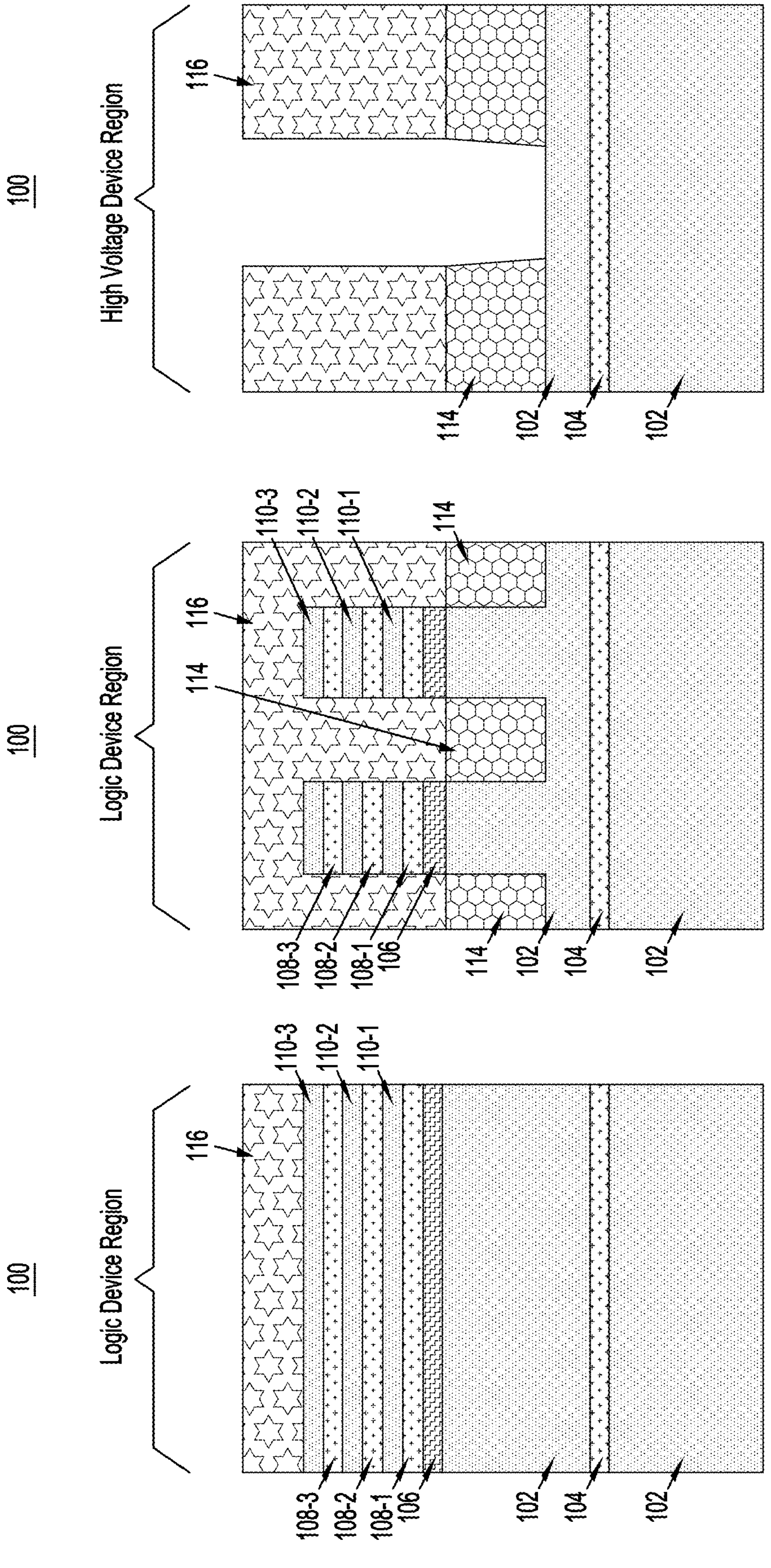
FIG. 3A is a cross-sectional view of the semiconductor structure showing the logic device region taken along the X1-X1 axis of FIG. 1A following deposition of a mask layer, according to an illustrative embodiment.
FIG. 3B is a cross-sectional view of the semiconductor structure showing the logic device region taken along the Y1-Y1 axis of FIG. 1A following deposition of a mask layer, according to an illustrative embodiment.
FIG. 3C is a cross-sectional view of the semiconductor structure showing the high voltage device region taken along the X2-X2 axis of FIG. 1A following deposition of a mask layer, according to an illustrative embodiment.

Referring now to FIGS. 3A-3C, the semiconductor structure 100 is shown following deposition of a mask layer 116 according to an embodiment of the invention. The mask layer 116 (e.g., a diode mask which may be comprised of photoresist, or other suitable protective material such an organic planarization layer (OPL) or a spin-on-carbon (SOC)) is formed on the semiconductor structure 100 using any conventional deposition process such spin-on coating or any other suitable deposition process. Next, an opening is formed in the mask layer 116 and through the STI regions 114 in the high voltage device region (see FIG. 3C) of the semiconductor structure 100 to expose a top surface of the substrate 102. The opening can be formed by utilizing conventional lithographic and selective etch processes such as a wet or dry etch etching process in the mask layer 116 and the STI regions 114.

Figure 4C:
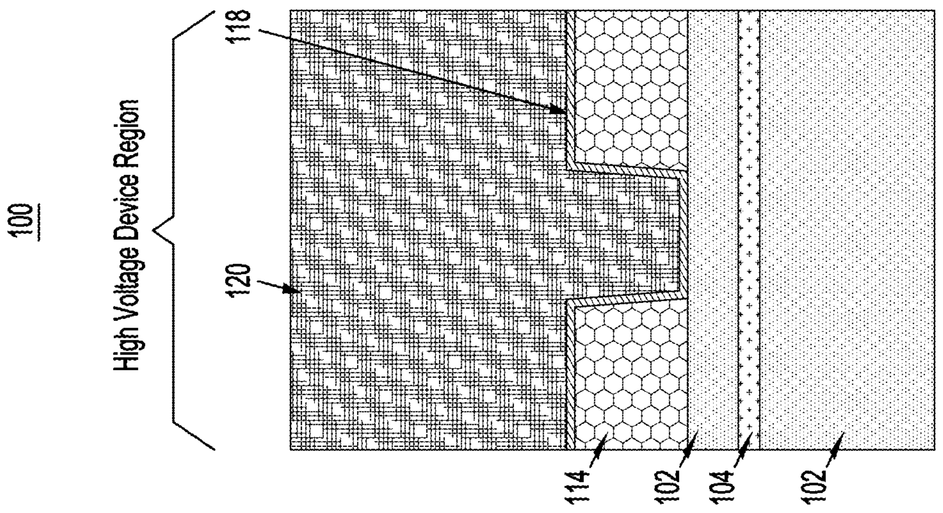
FIG. 4C is a cross-sectional view of the semiconductor structure showing the high voltage device region taken along the X2-X2 axis of FIG. 1A following the removal of the mask layer and formation of a gate dielectric layer and a dummy gate layer, according to an illustrative embodiment.
Figure 4B:
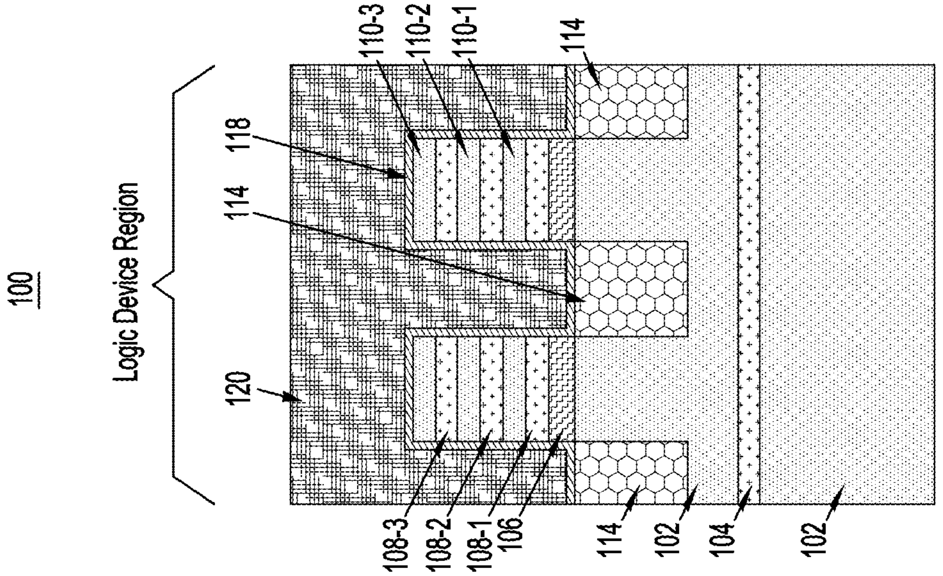
FIG. 4B is a cross-sectional view of the semiconductor structure showing the logic device region taken along the Y1-Y1 axis of FIG. 1A following the removal of the mask layer and formation of a gate dielectric layer and a dummy gate layer, according to an illustrative embodiment.
Figure 4A:
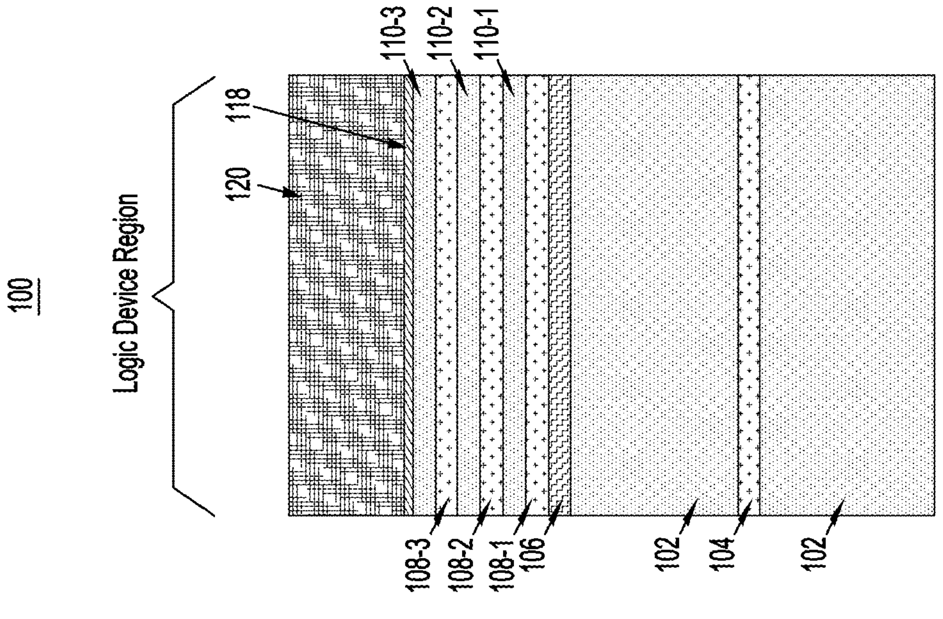
FIG. 4A is a cross-sectional view of the semiconductor structure showing the logic device region taken along the X1-X1 axis of FIG. 1A following the removal of the mask layer and formation of a gate dielectric layer and a dummy gate layer, according to an illustrative embodiment.

Referring now to FIGS. 4A-4C, the semiconductor structure 100 is shown following the removal of the mask layer 116 and formation of a gate dielectric layer 118 and a dummy gate layer 120 according to an embodiment of the invention. The mask layer 116 can be removed by, for example, an ash etching process. Next, prior to formation of the dummy gate layer 120, the gate dielectric layer 118 is deposited over the top-most nanosheet channel layer 110-3 and on the STI regions 114 as depicted in FIGS. 4A and 4B and over the STI regions 114 and on the substrate 102 as depicted in FIG. 4C. A suitable material for the gate dielectric layer 118 includes, for example, $SiO_2$ or SiON. In some embodiments, the gate dielectric layer 118 can be a layer having a thickness of from about 2 to about 30 nanometers (nm). In some embodiments, the gate dielectric layer 118 can be a so-called "extended gate" (EG) oxide. The gate dielectric layer 118 disposed between a gate extension 141 as discussed below and the backside channel, i.e., the backside of substrate 102 with source/drain regions 160 permits formation of a thicker gate dielectric layer.

The dummy gate layer 120 is then formed on the gate dielectric layer 118 by depositing and planarizing a layer of dummy gate material. In some embodiments, the dummy gate material can be polycrystalline Si. In some embodiments, the dummy gate material can be amorphous silicon (a-Si) or amorphous silicon germanium (a-SiGe). After being deposited, the dummy gate material is planarized (e.g., by CMP) to a desired level.

Figure 5C:
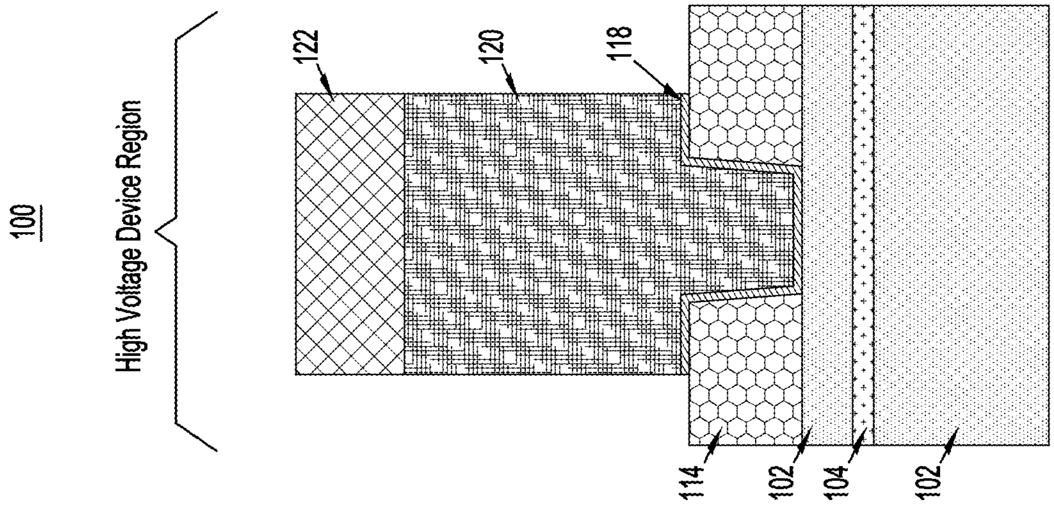
FIG. 5C is a cross-sectional view of the semiconductor structure showing the high voltage device region taken along the X2-X2 axis of FIG. 1A following the formation of dummy gate stacks, according to an illustrative embodiment.
Figure 5B:
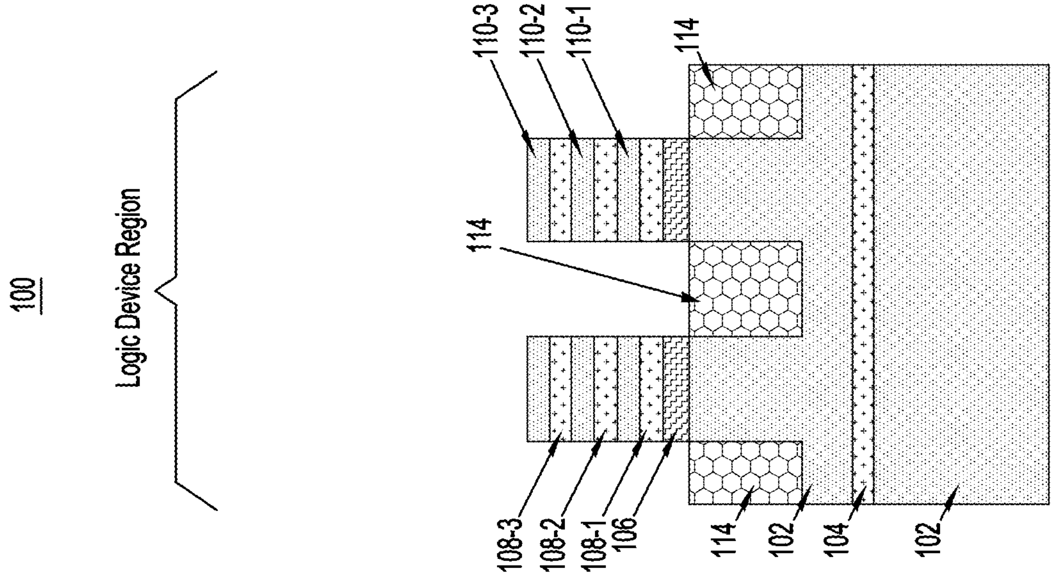
FIG. 5B is a cross-sectional view of the semiconductor structure showing the logic device region taken along the Y1-Y1 axis of FIG. 1A following the formation of dummy gate stacks, according to an illustrative embodiment.
Figure 5A:
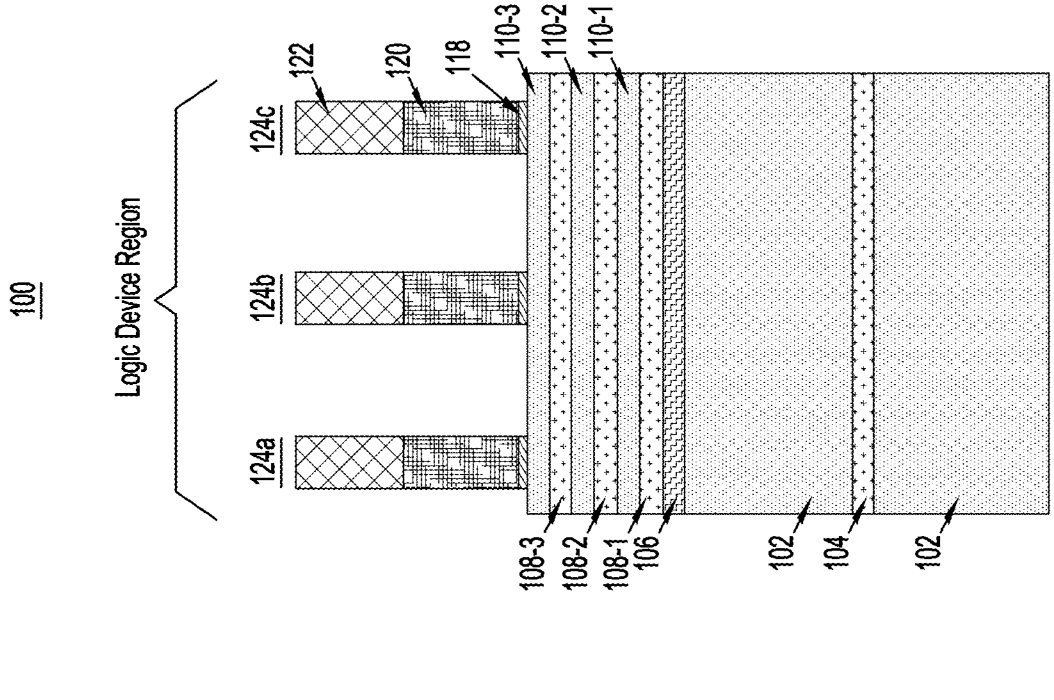
FIG. 5A is a cross-sectional view of the semiconductor structure showing the logic device region taken along the X1-X1 axis of FIG. 1A following the formation of dummy gate stacks, according to an illustrative embodiment.

Referring now to FIGS. 5A-5C, the semiconductor structure 100 is shown following the formation of dummy gate stacks 124*a*, 124*b* and 124*c* according to an embodiment of the invention. The dummy gate stacks 124*a*, 124*b* and 124*c* are formed by depositing a gate hard mask (HM) layer 122 on the dummy gate layer 120 using conventional deposition techniques such as ALD. Suitable material for the gate HM layer 122 includes, for example, oxide and nitride materials such as silicon nitride (SiN), a multi-layer of SiN and $SiO_2$, or other suitable material. The gate HM layer 122 is then patterned followed by lithographic processing to result in the dummy gate stacks 124*a*, 124*b* and 124*c* composed of patterned gate HM layer 122 and the underlying dummy gate layer 120 as shown in FIG. 5A. The dummy gate layer 120 is selectively etched such that portions of the dummy gate layer 120 that are not under the gate HM layer 122 are removed. In addition, known fabrication operations can be used to selectively remove the portions of the gate dielectric layer 118 that are not under the dummy gate layer 120, and a diluted hydrofluoric acid (DHF) cleaning has been performed to ensure that all of the gate dielectric layer 118 that is not under the dummy gate layer 120 has been removed.

Figure 6A:
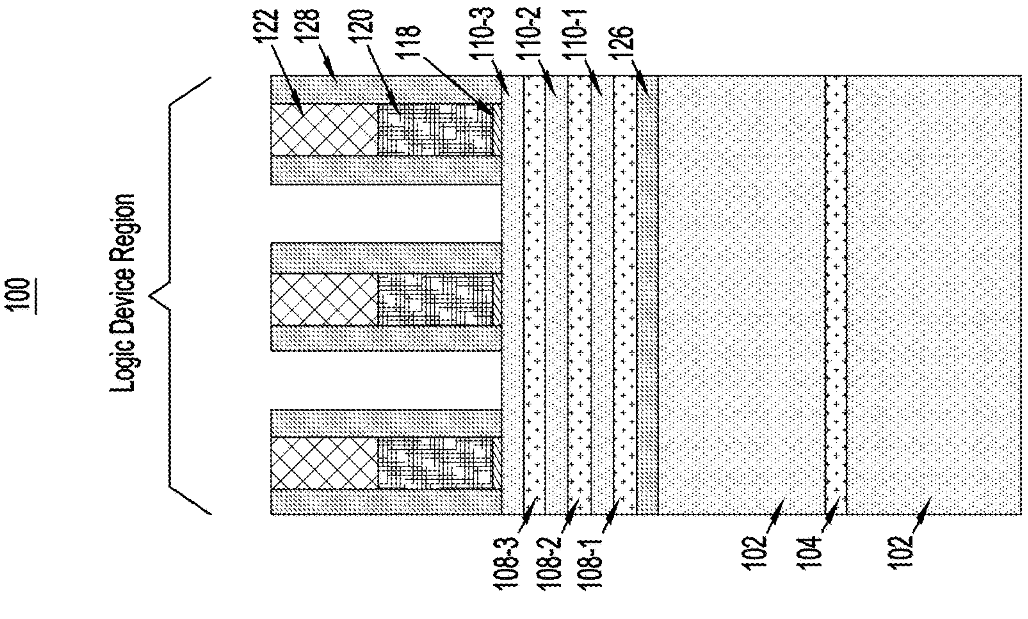
FIG. 6A is a cross-sectional view of the semiconductor structure showing the logic device region taken along the X1-X1 axis of FIG. 1A following the removal of the sacrificial layer, according to an illustrative embodiment.
Figure 6B:
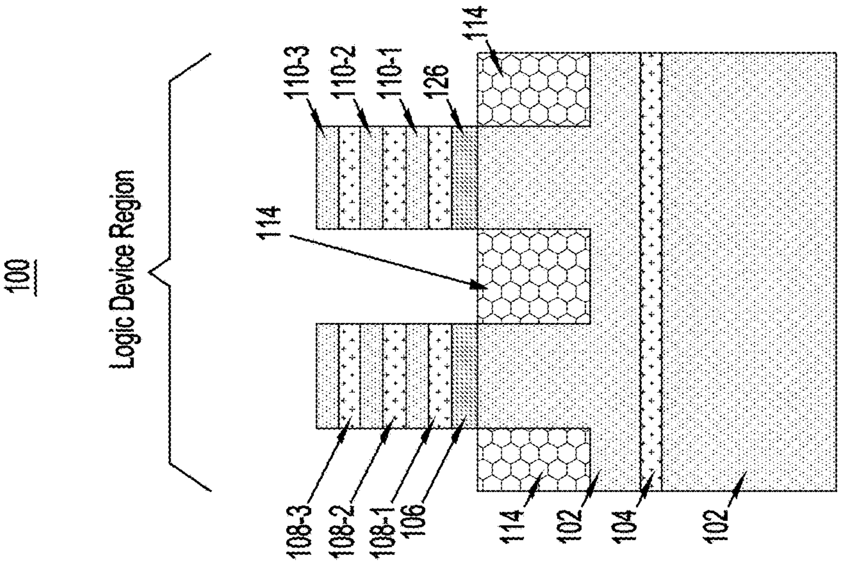
FIG. 6B is a cross-sectional view of the semiconductor structure showing the logic device region taken along the Y1-Y1 axis of FIG. 1A following the removal of the sacrificial layer, according to an illustrative embodiment.
Figure 6C:
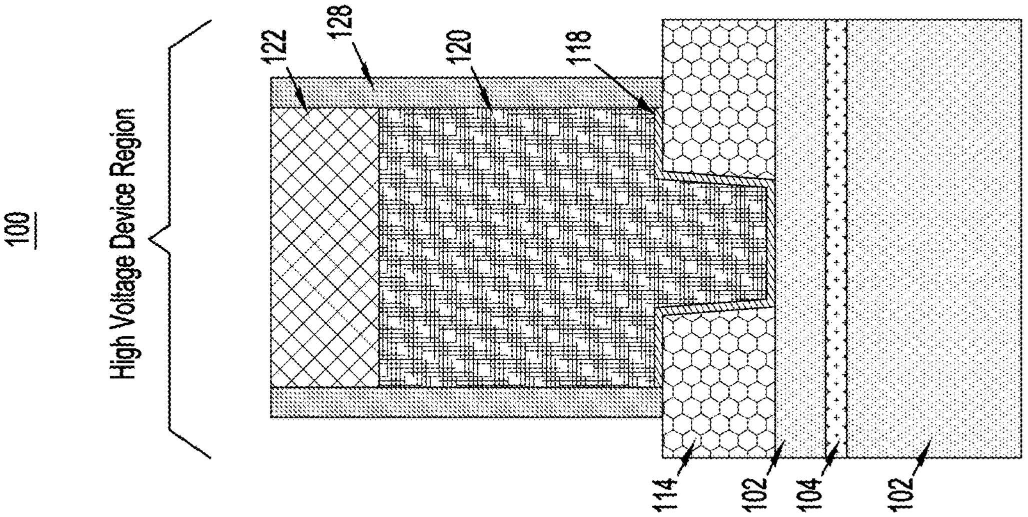
FIG. 6C is a cross-sectional view of the semiconductor structure showing the high voltage device region taken along the X2-X2 axis of FIG. 1A following the removal of the sacrificial layer, according to an illustrative embodiment.

Referring now to FIGS. 6A-6C, the semiconductor structure 100 is shown following the removal of the sacrificial layer 106 according to an embodiment of the invention. The sacrificial layer 106 can be removed using known fabrication operations, followed by depositing a dielectric material used to form a bottom dielectric insulator (BDI) layer 126 in the space that was occupied by the removed sacrificial layer 106, and to form gate sidewall spacers 128 on sidewalls of the dummy gate layer 120 and the gate HM layer 122 by conformal dielectric liner deposition. In some embodiments, the dielectric material for forming the BDI layer 126 and the gate sidewall spacers 128 can independently be any suitable dielectric material including, for example, silicon oxide, silicon nitride, silicon oxynitride, SiBCN, SiOCN, SiOC, or any suitable combination of those materials. In some embodiments, the dielectric material can be a low-k dielectric material.

Figure 7A:
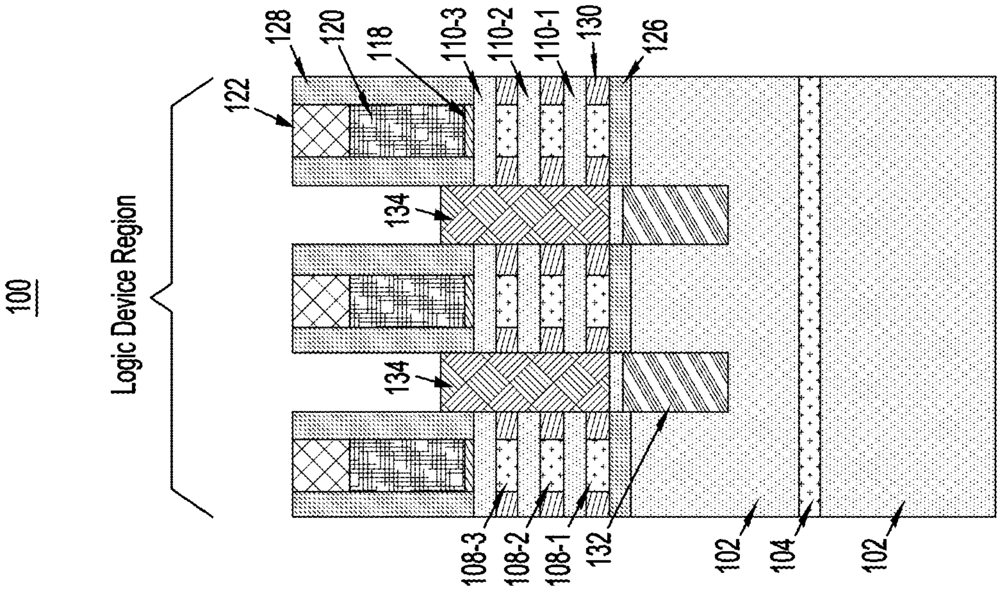
FIG. 7A is a cross-sectional view of the semiconductor structure showing the logic device region taken along the X1-X1 axis of FIG. 1A following the formation of inner spacers, sacrificial placeholders, a buffer semiconductor layer and source/drain regions, according to an illustrative embodiment.
Figure 7B:
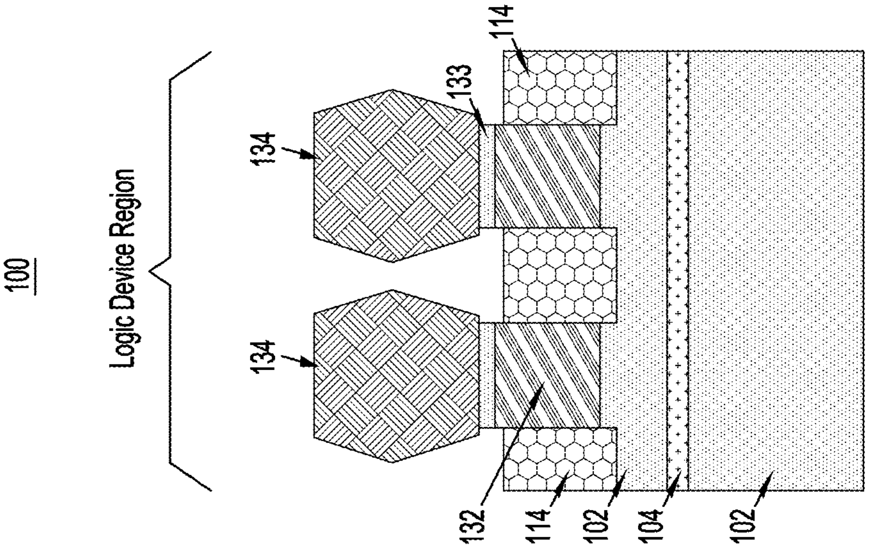
FIG. 7B is a cross-sectional view of the semiconductor structure showing the logic device region taken along the Y1-Y1 axis of FIG. 1A following the formation of inner spacers, sacrificial placeholders, a buffer semiconductor layer and source/drain regions, according to an illustrative embodiment.
Figure 7C:
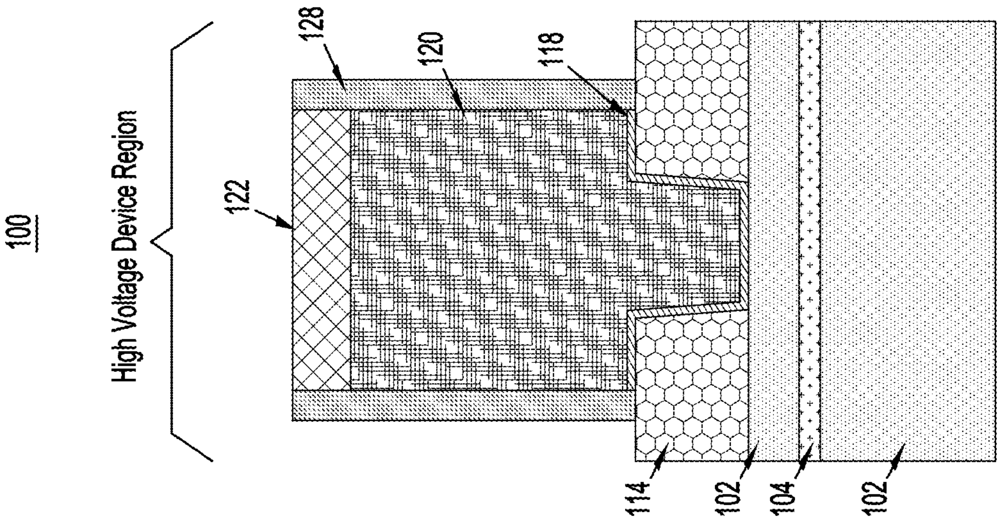
FIG. 7C is a cross-sectional view of the semiconductor structure showing the high voltage device region taken along the X2-X2 axis of FIG. 1A following the formation of inner spacers, sacrificial placeholders, a buffer semiconductor layer and source/drain regions, according to an illustrative embodiment.

Referring now to FIGS. 7A-7C, the semiconductor structure 100 is shown following the formation of inner spacers 130, sacrificial placeholders 132, a buffer semiconductor layer 133 and source/drain regions 134 according to an embodiment of the invention. The inner spacers 130 are formed by using known semiconductor device fabrication processes to remove portions of the sacrificial layers 108 and the nanosheet channel layers 110, followed by removing indent spaces (e.g., resulting from indent etches of the sacrificial layers 108 prior to their removal) in forming the inner spacers 130 in the end region cavities (not shown) formed in the end regions of the sacrificial layers 108 (see FIG. 7A). In some embodiments, a conformal deposition process is used to deposit a dielectric material over the end region cavities such that the dielectric material pinches off in the end region cavities to form the inner spacers 130. A subsequent isotropic or anisotropic etch back is performed to remove excess dielectric material on exposed vertical and horizontal surfaces of the semiconductor structure 100. Suitable material for the inner spacers 130 includes, for example, silicon nitride (SiN), SiBCN, silicon carbide oxide (SiCO), SiOCN or any other type of dielectric material (e.g., a dielectric material having a dielectric constant k of less than about 5).

The sacrificial placeholders 132 are formed in the substrate 102 using, for example, an RIE process to remove portions of the substrate 102, followed by depositing a sacrificial material using conventional deposition techniques such as ALD. The sacrificial placeholders 132 may be formed of a sacrificial material such as, for example, SiGe, titanium oxide ($TiO_x$), aluminum oxide ($AlO_x$), silicon carbide (SiC), etc.

The buffer semiconductor layer 133 can be formed on the sacrificial placeholders 132 in order to prevent source/drain epitaxy erosion during the placeholder removal process from the backside as discussed below. The buffer semiconductor layer 133 can be formed using known growing/deposition techniques such as, for example, epitaxial growth, ALD, etc. The buffer semiconductor layer 133 can be any material discussed above for the nanosheet channel layers 110.

The source/drain regions 134 can be formed on the buffer semiconductor layer 133. The source/drain regions 134 may be formed using epitaxial growth processes. The source/drain regions 134 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (TI). In some embodiments, the epitaxy process comprises in-situ doping (dopants are incorporated in epitaxy material during epitaxy).

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain region can range from $1\times10^{19}$ $cm^{-3}$ to $3\times10^{21}$ $cm^{-3}$, or preferably between $2\times10^{20}$ $cm^{-3}$ to $3\times10^{21}$ $cm^{-3}$.

Figure 8A:
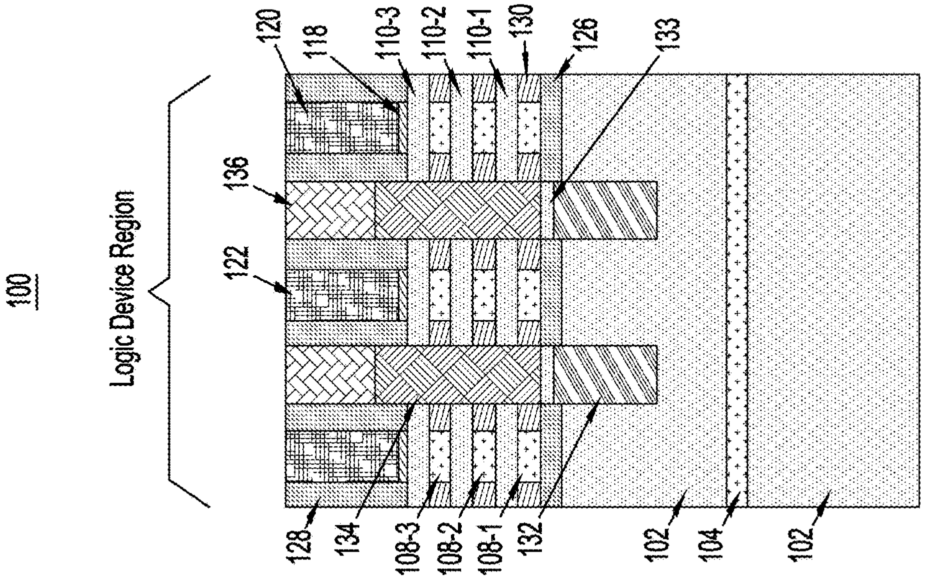
FIG. 8A is a cross-sectional view of the semiconductor structure showing the logic device region taken along the X1-X1 axis of FIG. 1A following removal of a gate hardmask layer and the gate sidewall spacers abutting the sidewall of the gate hardmask layer, according to an illustrative embodiment.
Figure 8B:
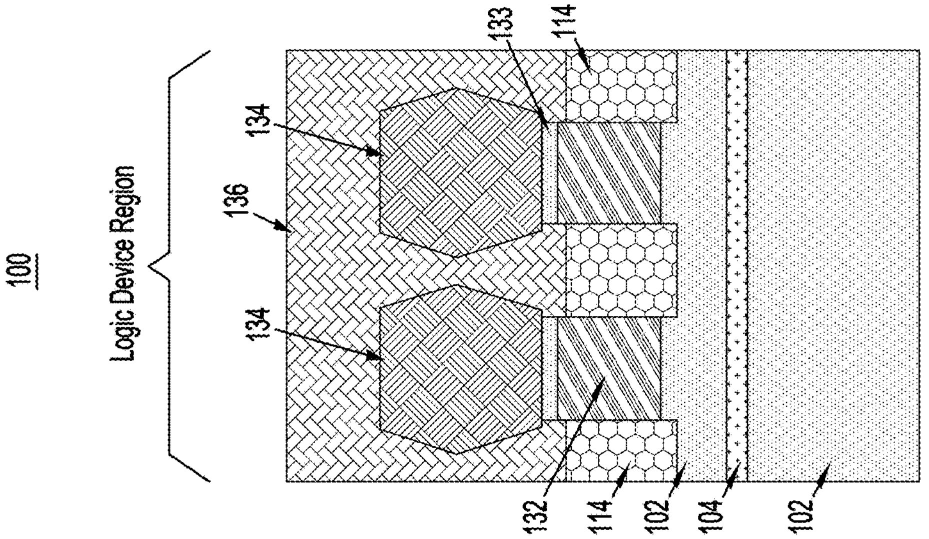
FIG. 8B is a cross-sectional view of the semiconductor structure showing the logic device region taken along the Y1-Y1 axis of FIG. 1A following removal of a gate hardmask layer and the gate sidewall spacers abutting the sidewall of the gate hardmask layer, according to an illustrative embodiment.
Figure 8C:
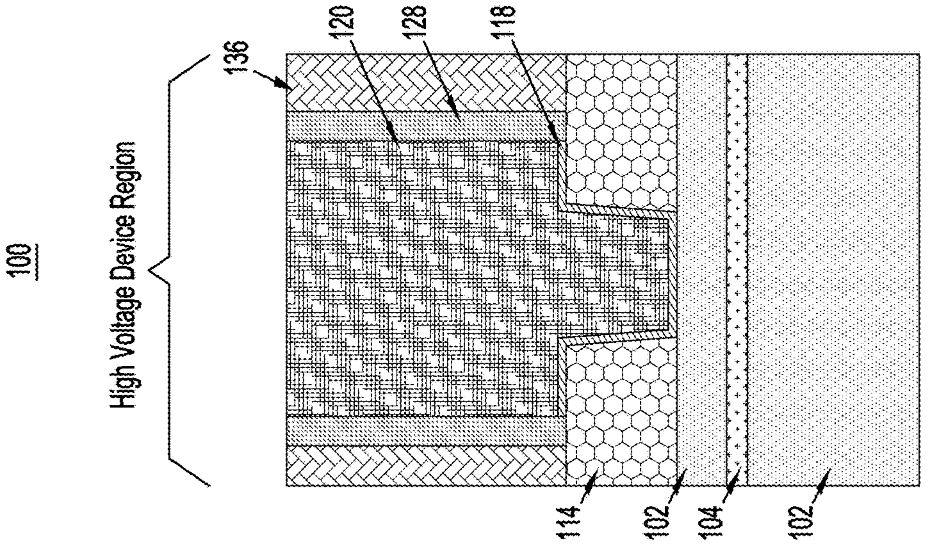
FIG. 8C is a cross-sectional view of the semiconductor structure showing the high voltage device region taken along the X2-X2 axis of FIG. 1A following removal of a gate hardmask layer and the gate sidewall spacers abutting the sidewall of the gate hardmask layer, according to an illustrative embodiment.

Referring now to FIGS. 8A-8C, the semiconductor structure 100 is shown following removal of the gate HM layer 122 and the gate sidewall spacers 128 abutting the sidewall of the gate HM layer 122 according to an embodiment of the invention. The gate HM layer 122 and the gate sidewall spacers 128 abutting the sidewall of the gate HM layer 122 can be removed using a selective etching process such as RIE. Next, an interlevel dielectric (ILD) layer 136 is formed on the source/drain regions 134 and on the STI regions 114. The ILD layer 136 may be formed of any suitable isolating material, such as $SiO_2$, SiOC, SiON, etc., using conventional deposition techniques such as ALD, CVD, etc., followed by a planarization process such as CMP.

Figure 9C:
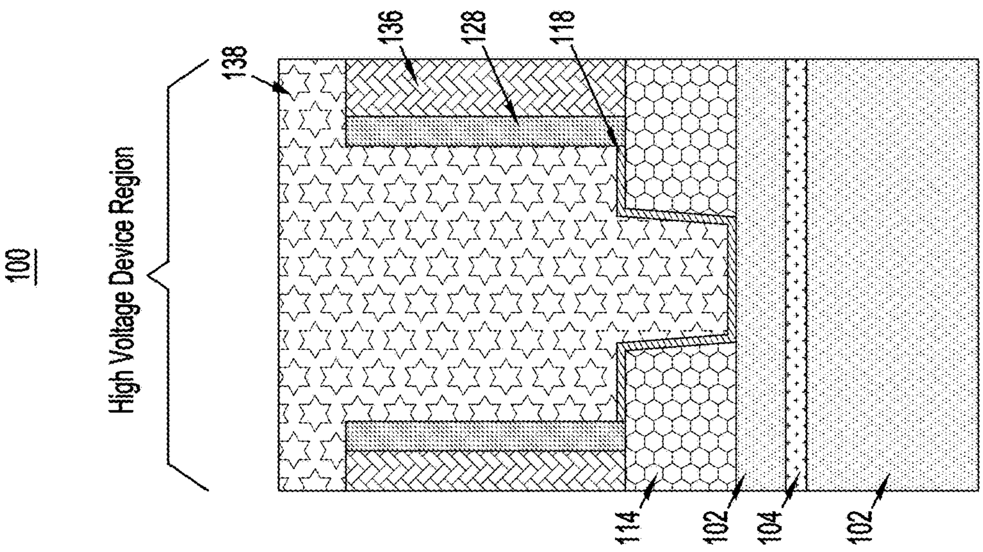
FIG. 9C is a cross-sectional view of the semiconductor structure showing the high voltage device region taken along the X2-X2 axis of FIG. 1A following the removal of the dummy gate layer and deposition of a mask layer, according to an illustrative embodiment.
Figure 9B:
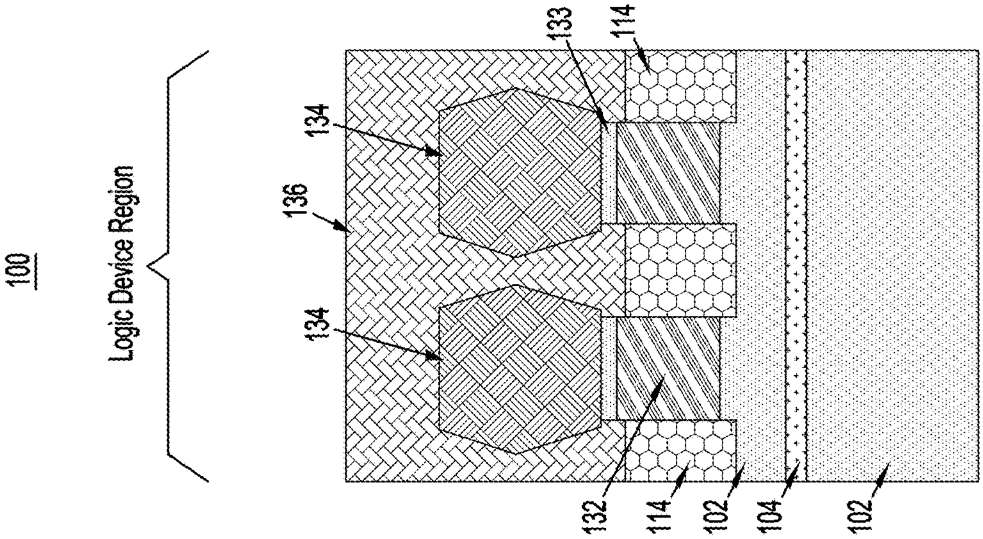
FIG. 9B is a cross-sectional view of the semiconductor structure showing the logic device region taken along the Y1-Y1 axis of FIG. 1A following the removal of the dummy gate layer and deposition of a mask layer, according to an illustrative embodiment.
Figure 9A:
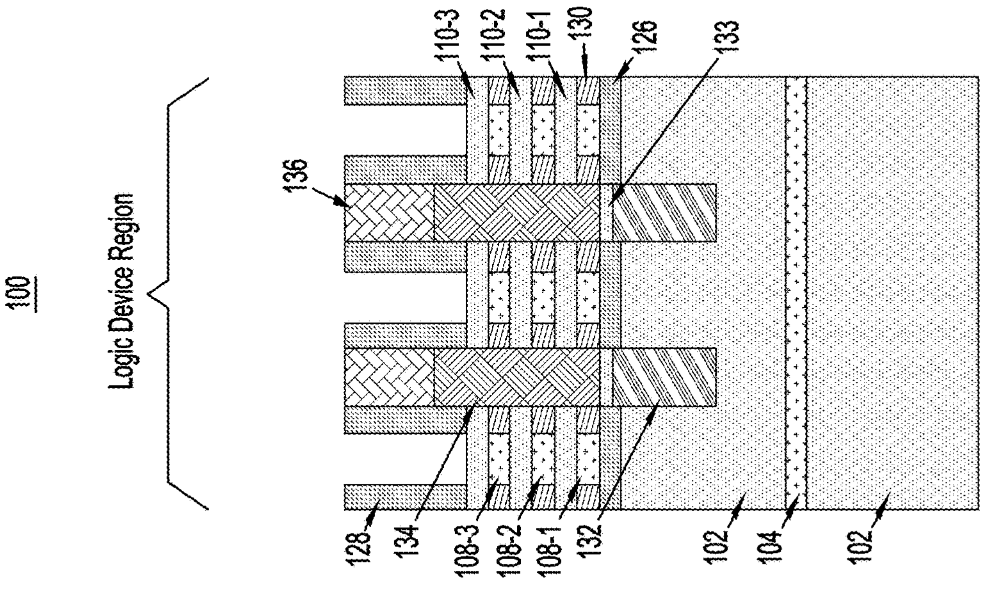
FIG. 9A is a cross-sectional view of the semiconductor structure showing the logic device region taken along the X1-X1 axis of FIG. 1A following the removal of the dummy gate layer and deposition of a mask layer, according to an illustrative embodiment.

Referring now to FIGS. 9A-9C, the semiconductor structure 100 is shown following the removal of the dummy gate layer 120 and deposition of a mask layer 138 according to an embodiment of the invention. The dummy gate layer 120 is first removed using a selective etching process such as RIE or wet removal processes. Next, the mask layer 138 is formed in the opening created by the removal of the dummy gate layer 120 shown in FIG. 9C to protect the gate dielectric layer 118 in the high voltage device region. The exposed gate dielectric layer 118 in the logic device region in FIG. 9A is then removed using a selective wet or dry etching process to expose the top-most nanosheet channel layer 110-3. The mask layer 138 can be formed by similar processes and material as the mask layer 116.

Figure 10C:
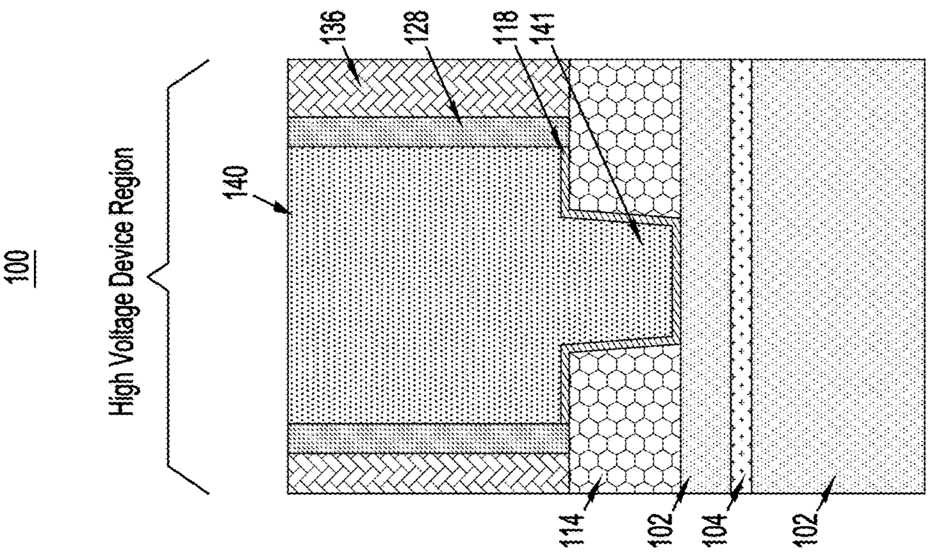
FIG. 10C is a cross-sectional view of the semiconductor structure showing the high voltage device region taken along the X2-X2 axis of FIG. 1A following the removal of the mask layer and the sacrificial layers and deposition of a replacement gate structure, according to an illustrative embodiment.
Figure 10B:
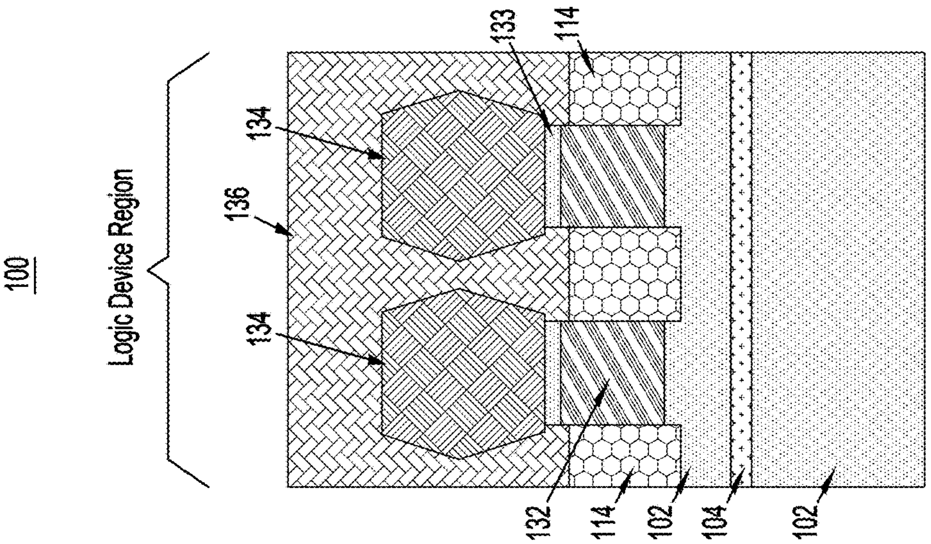
FIG. 10B is a cross-sectional view of the semiconductor structure showing the logic device region taken along the Y1-Y1 axis of FIG. 1A following the removal of the mask layer and the sacrificial layers and deposition of a replacement gate structure, according to an illustrative embodiment.
Figure 10A:
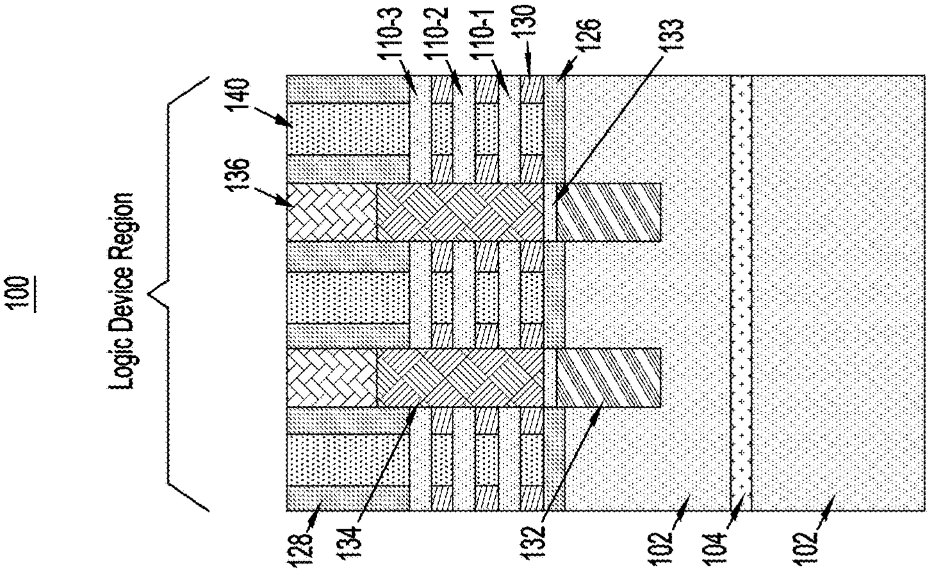
FIG. 10A is a cross-sectional view of the semiconductor structure showing the logic device region taken along the X1-X1 axis of FIG. 1A following the removal of the mask layer and the sacrificial layers and deposition of a replacement gate structure, according to an illustrative embodiment.

Referring now to FIGS. 10A-10C, the semiconductor structure 100 is shown following the removal of the mask layer 138 and the sacrificial layers 108 and deposition of a replacement gate structure 140 according to an embodiment of the invention. The mask layer 138 can be removed by, for example, an ash etching process. Next, known semiconductor fabrication operations are used to remove the sacrificial layers 108 selective to the nanosheet channel layers 110. In some embodiments, because the sacrificial layers 108 are formed from SiGe, they can be selectively etched with respect to the nanosheet channel layers 110 formed from Si using, for example, a vapor phase hydrogen chloride (HCL) gas isotropic etch process.

The removed sacrificial layers 108 and the removed dummy gate layer 120 are replaced with the replacement gate structure 140 (shown in FIG. 10A), and the removed mask layer 138 is replaced with the replacement gate structure 140 (shown in FIG. 10C) using known replacement high-k metal gate (HKMG) processing operations. FIG. 10C further shows the replacement gate structure 140 having a gate extension 141 extending from the bottom of the replacement gate structure 140 to the gate dielectric layer 118 on the substrate 102 and between opposing sidewalls of the STI regions 114. In some embodiments, the gate extension 141 will be formed of the same material as the replacement gate structure 140 as discussed below. In some embodiments, the replacement gate structure 140 may comprise a gate dielectric layer and a gate conductor layer. The gate dielectric layer may be formed of a high-k dielectric material. Examples of high-k dielectric materials include, but are not limited to, metal oxides such as $HfO_2$, hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg).

The gate conductor layer may include a metal gate or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. It should be appreciated that various other materials may be used for the gate conductor layer as desired.

Figures 11A, 11B, 11C:
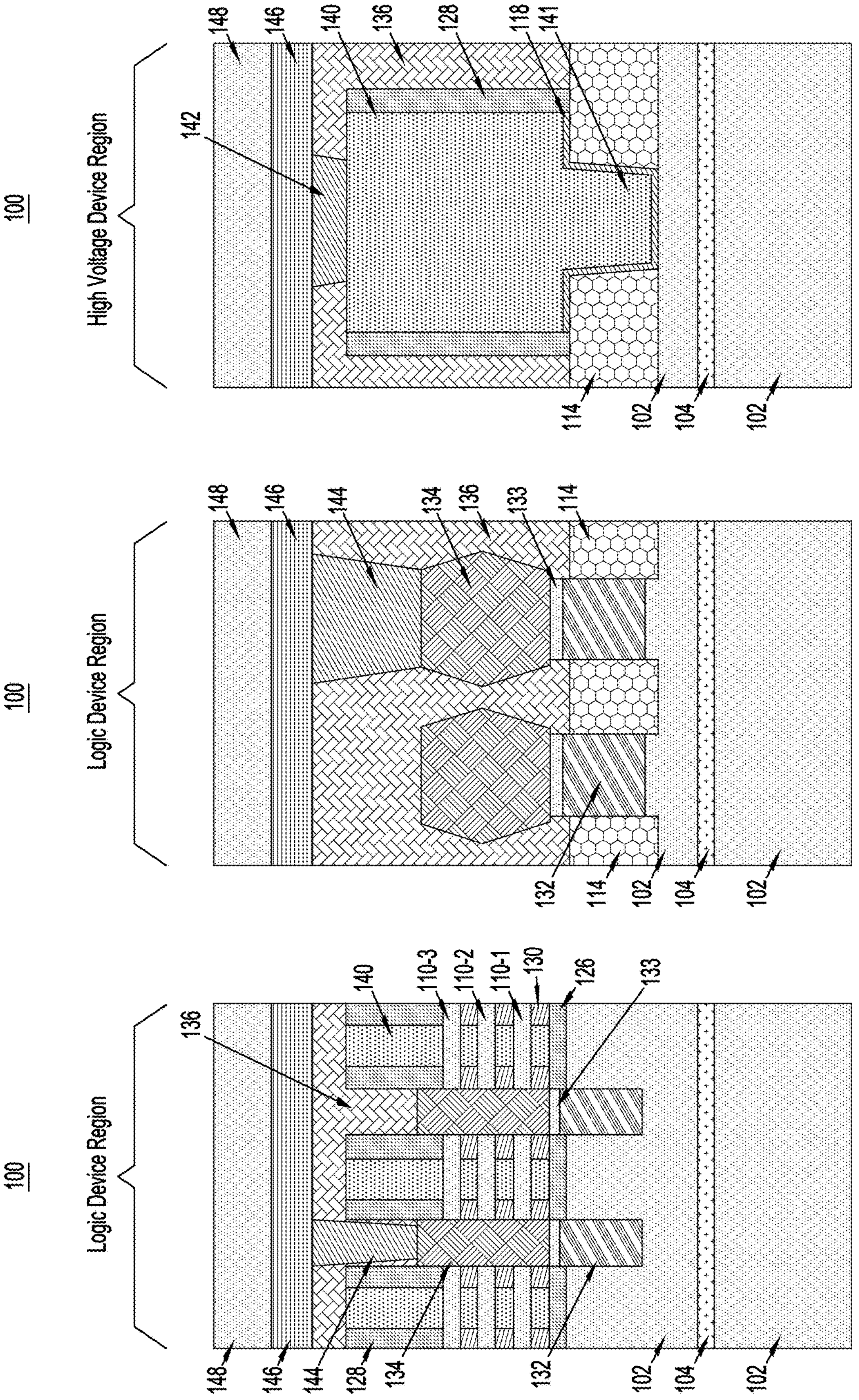
FIG. 11A is a cross-sectional view of the semiconductor structure showing the logic device region taken along the X1-X1 axis of FIG. 1A following the formation of middle-of-the-line contacts, a frontside back-end-of-line (BEOL) interconnect and a carrier wafer, according to an illustrative embodiment.
FIG. 11B is a cross-sectional view of the semiconductor structure showing the logic device region taken along the Y1-Y1 axis of FIG. 1A following the formation of middle-of-the-line contacts, a frontside back-end-of-line (BEOL) interconnect and a carrier wafer, according to an illustrative embodiment.
FIG. 11C is a cross-sectional view of the semiconductor structure showing the high voltage device region taken along the X2-X2 axis of FIG. 1A following the formation of middle-of-the-line contacts, a frontside back-end-of-line (BEOL) interconnect and a carrier wafer, according to an illustrative embodiment.

Referring now to FIGS. 11A-11C, the semiconductor structure 100 is shown following the formation of middle-of-the-line contacts 142 and 144, a frontside back-end-of-line (BEOL) interconnect 146 and a carrier wafer 148 according to an embodiment of the invention. The middle-of-the-line contacts 142 and 144, which can also be referred to as gate contact 142 (see FIG. 10C) in the high voltage device region and source/drain contacts 144 (see FIGS. 10A and 10B) in the logic device region can be formed by any conventional technique. In some embodiments, the middle-of-the-line contacts 142 and 144 can be formed by depositing an additional amount of the ILD layer 136 and utilizing conventional lithographic and selective etch processes such as a wet or dry etch etching process in the ILD layer 136 to form an opening. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As another example, a wet etching process may comprise etching in DHF, potassium hydroxide (KOH) solution, ammonia, a solution containing hydrofluoric acid (HF), nitric acid ($HNO_3$), and/or acetic acid ($CH_3COOH$), or other suitable wet etchants.

Next, a high conductive metal is deposited in the openings to form the middle-of-the-line contacts 142 and 144. Suitable high conductive metals include, for example, conductive material such as, for example, tungsten (W), aluminum (Al), copper (Cu), cobalt (Co), ruthenium (Ru), molybdenum (Mo), or any other suitable conductive material. In various embodiments, the high conductive metal can be deposited by ALD, CVD, PVD, and/or plating. The high conductive metal can be planarized using, for example, a planarizing process such as CMP. Other planarization processes can include grinding and polishing.

The frontside BEOL interconnect 146 is then formed followed by bonding of the structure (e.g., the frontside BEOL interconnect 146) to the carrier wafer 148. The frontside BEOL interconnect 146 includes various BEOL interconnect structures. For example, the frontside BEOL interconnect 146 is a metallization structure that includes one or more metal layers disposed on a side of the semiconductor structure 100 opposite of the side on which the backside BEOL metallization structure is disposed. The metal layers of the frontside BEOL interconnect 146 each have metal lines for making interconnections to the semiconductor device.

The carrier wafer 148 may be formed of materials similar to that of the substrate 102, and may be formed over the frontside BEOL interconnect 146 using a wafer bonding process, such as dielectric-to-dielectric bonding.

Figure 12C:
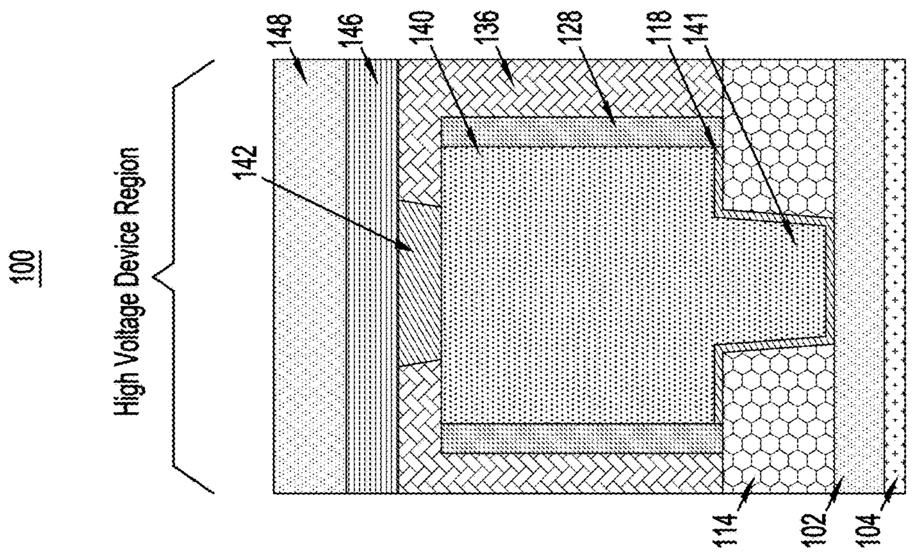
FIG. 12C is a cross-sectional view of the semiconductor structure showing the high voltage device region taken along the X2-X2 axis of FIG. 1A following backside processing of the substrate to remove portions of the substrate, according to an illustrative embodiment.
Figure 12B:
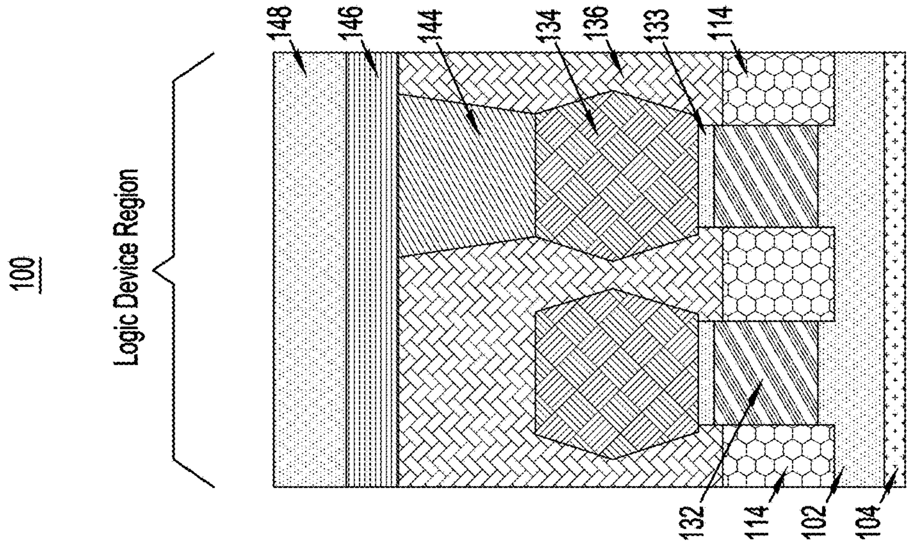
FIG. 12B is a cross-sectional view of the semiconductor structure showing the logic device region taken along the Y1-Y1 axis of FIG. 1A following backside processing of the substrate to remove portions of the substrate, according to an illustrative embodiment.
Figure 12A:
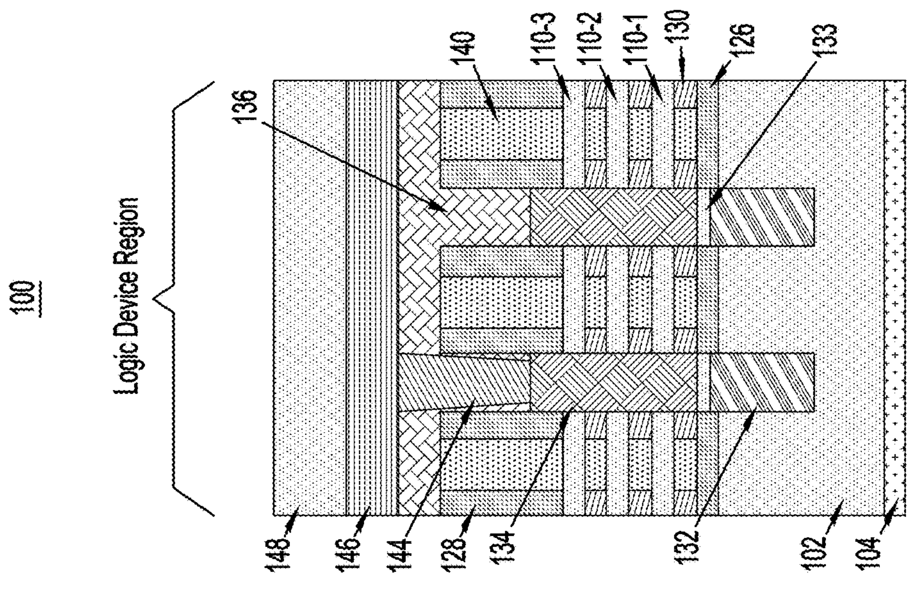
FIG. 12A is a cross-sectional view of the semiconductor structure showing the logic device region taken along the X1-X1 axis of FIG. 1A following backside processing of the substrate to remove portions of the substrate, according to an illustrative embodiment.

Referring now to FIGS. 12A-12C, the semiconductor structure 100 is shown following backside processing of the substrate 102 according to an embodiment of the invention. The backside processing can be carried out by, for example, by flipping the semiconductor structure 100 over so that the backside of the substrate 102 (i.e., the back surface) is facing up. First, portions of the substrate 102 may be removed from the backside using, for example, a combination of wafer grinding, CMP, dry etch and/or wet etch to selectively remove the substrate 102 until the etch stop layer 104 is reached.

Figure 13A:
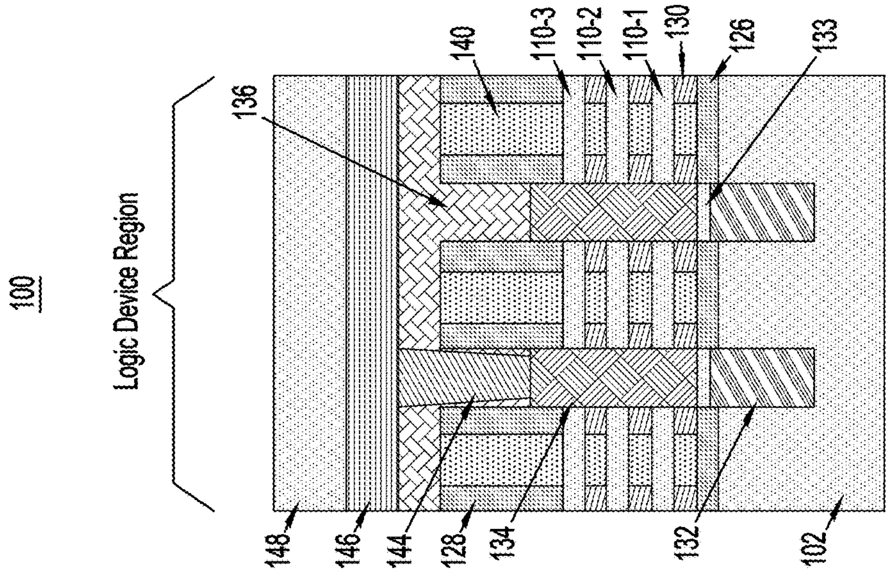
FIG. 13A is a cross-sectional view of the semiconductor structure showing the logic device region taken along the X1-X1 axis of FIG. 1A following removal of the etch stop layer, according to an illustrative embodiment.
Figure 13B:
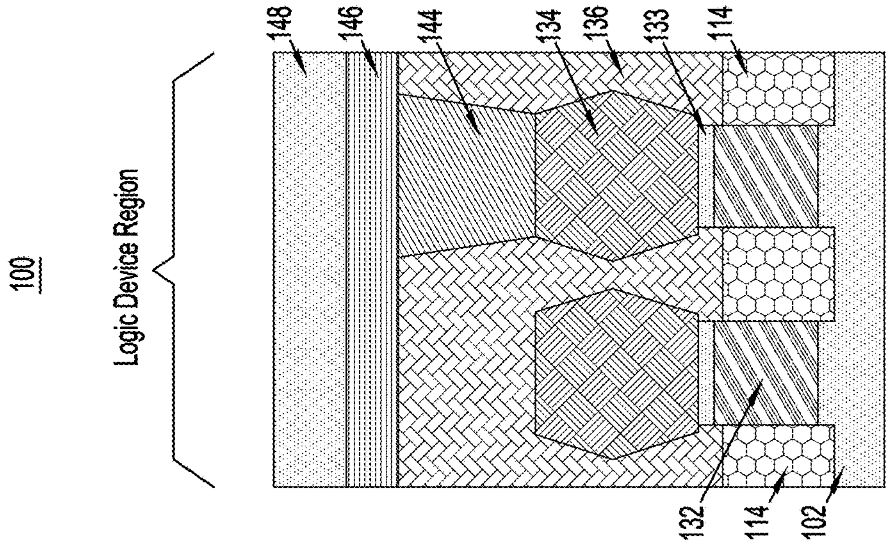
FIG. 13B is a cross-sectional view of the semiconductor structure showing the logic device region taken along the Y1-Y1 axis of FIG. 1A following removal of the etch stop layer, according to an illustrative embodiment.
Figure 13C:
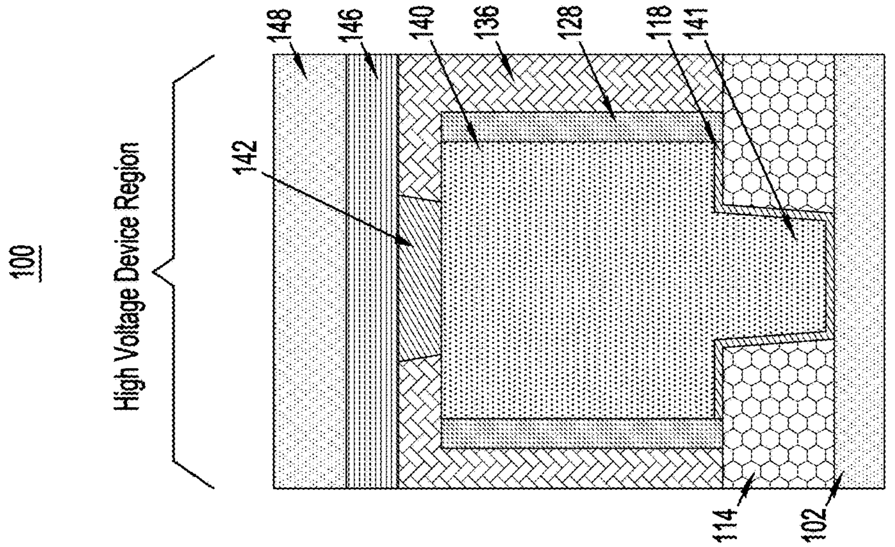
FIG. 13C is a cross-sectional view of the semiconductor structure showing the high voltage device region taken along the X2-X2 axis of FIG. 1A following removal of the etch stop layer, according to an illustrative embodiment.

Referring now to FIGS. 13A-13C, the semiconductor structure 100 is shown following removal of the etch stop layer 104 according to an embodiment of the invention. The etch stop layer 104 is selectively removed using, for example, a wet etch to selectively remove the etch stop layer 104 until the substrate 102 is reached.

Figure 14C:
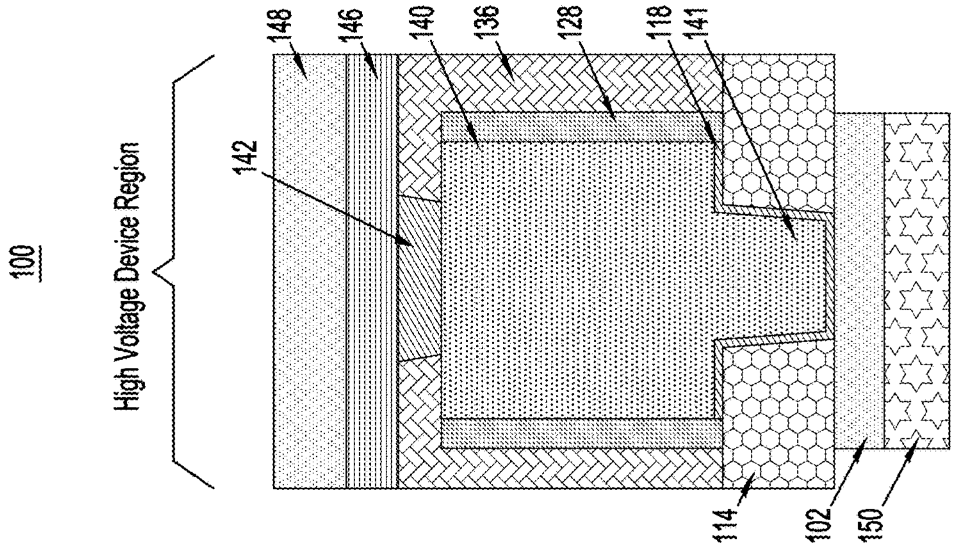
FIG. 14C is a cross-sectional view of the semiconductor structure showing the high voltage device region taken along the X2-X2 axis of FIG. 1A following the deposition of a mask layer, according to an illustrative embodiment.
Figure 14B:
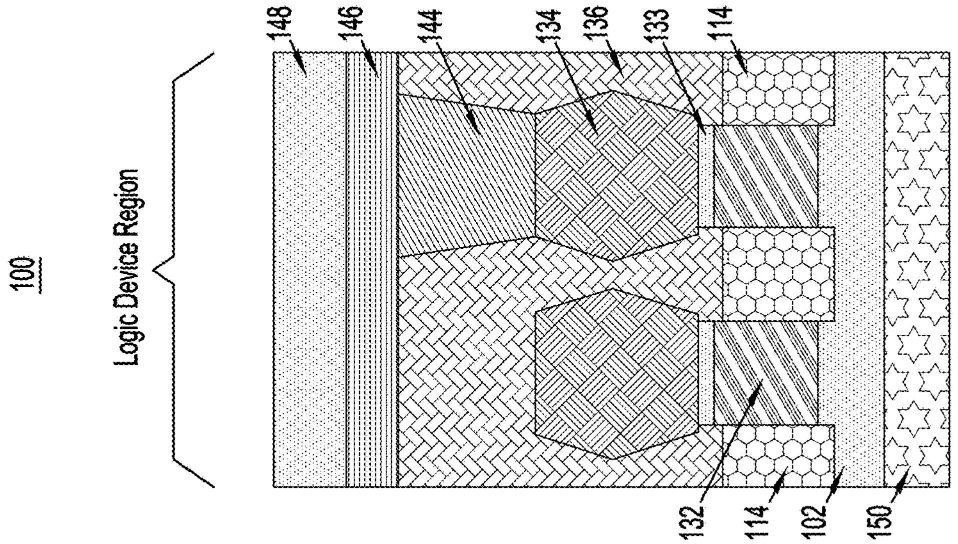
FIG. 14B is a cross-sectional view of the semiconductor structure showing the logic device region taken along the Y1-Y1 axis of FIG. 1A following the deposition of a mask layer, according to an illustrative embodiment.
Figure 14A:
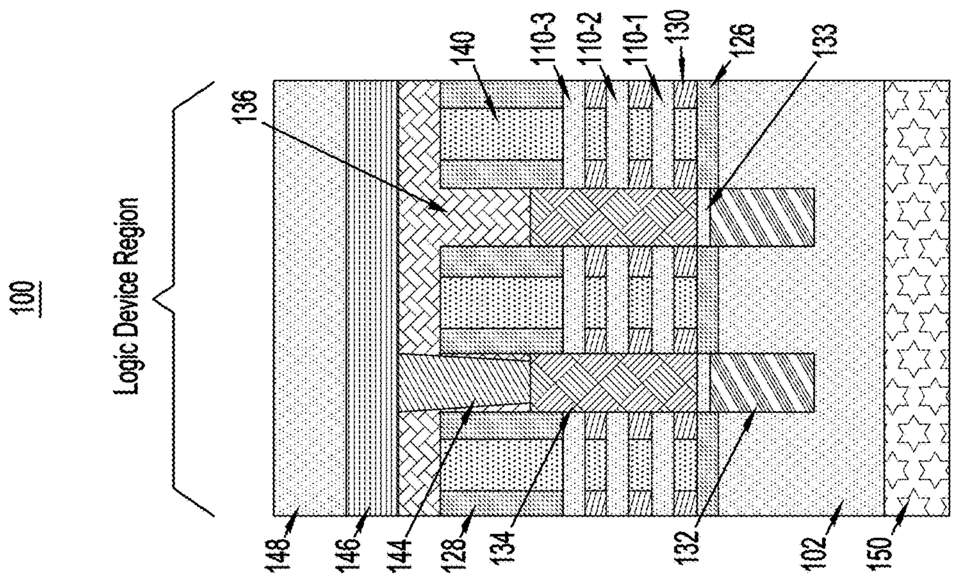
FIG. 14A is a cross-sectional view of the semiconductor structure showing the logic device region taken along the X1-X1 axis of FIG. 1A following the deposition of a mask layer, according to an illustrative embodiment.

Referring now to FIGS. 14A-14C, the semiconductor structure 100 is shown following the deposition of a mask layer 150 according to an embodiment of the invention. The mask layer 150 is deposited on the remaining portions of the substrate 102. The mask layer 150 can be formed by similar processes and material as the mask layer 116. Next, the mask layer 150 in the high voltage device region shown in FIG. 14C is patterned and then selectively removed with a portion of the remaining substrate 102 utilizing a selective etch process such as a wet etch to expose a portion of the STI regions 114.

Figure 15C:
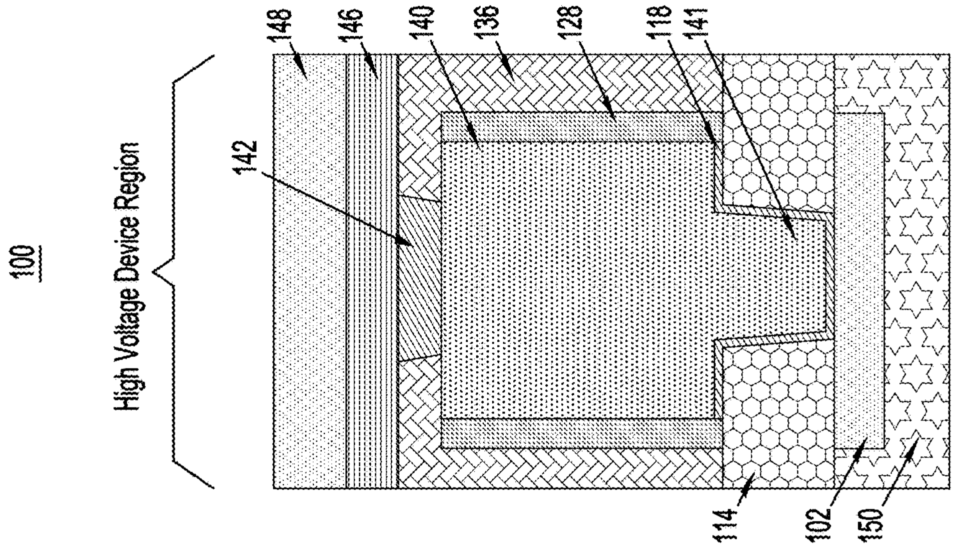
FIG. 15C is a cross-sectional view of the semiconductor structure showing the high voltage device region taken along the X2-X2 axis of FIG. 1A following deposition of an additional mask layer, followed by removal of the remaining portions of the substrate in the logic device regions, according to an illustrative embodiment.
Figure 15B:
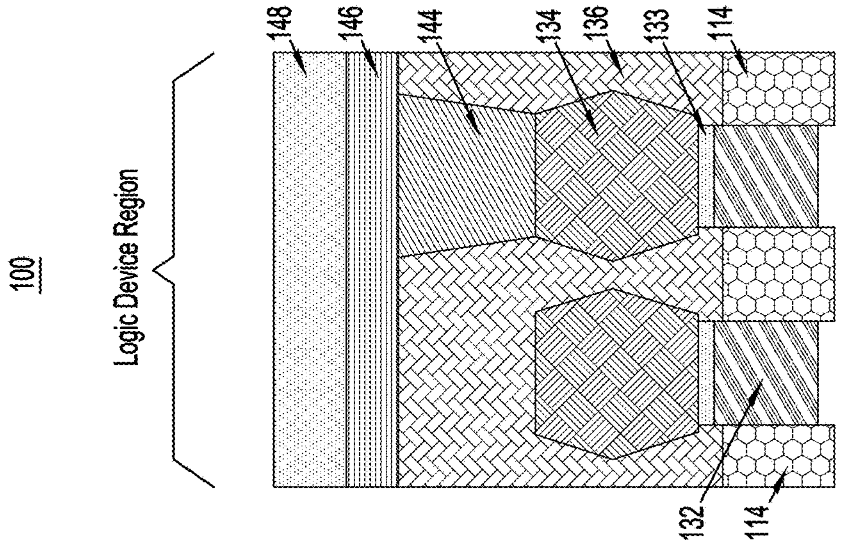
FIG. 15B is a cross-sectional view of the semiconductor structure showing the logic device region taken along the Y1-Y1 axis of FIG. 1A following deposition of an additional mask layer, followed by removal of the remaining portions of the substrate in the logic device regions, according to an illustrative embodiment.
Figure 15A:
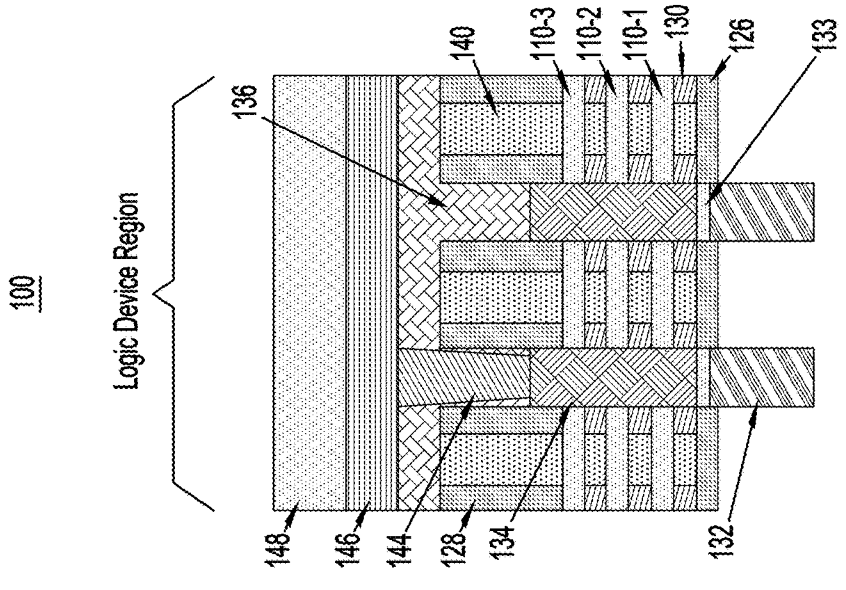
FIG. 15A is a cross-sectional view of the semiconductor structure showing the logic device region taken along the X1-X1 axis of FIG. 1A following deposition of an additional mask layer, followed by removal of the remaining portions of the substrate in the logic device regions, according to an illustrative embodiment.

Referring now to FIGS. 15A-15C, the semiconductor structure 100 is shown following deposition of an additional mask layer 150, followed by removal of the remaining portions of the substrate 102 in the logic device regions according to an embodiment of the invention. The additional mask layer 150 is deposited on the exposed STI regions 114 in the high voltage device region shown in FIG. 15C. The remaining portions of the substrate 102 in the logic device regions shown in FIGS. 15A and 15B are then removed utilizing a selective etch process such as a wet etch to expose the sacrificial placeholders 132 and the BDI layer 126.

Figure 16C:
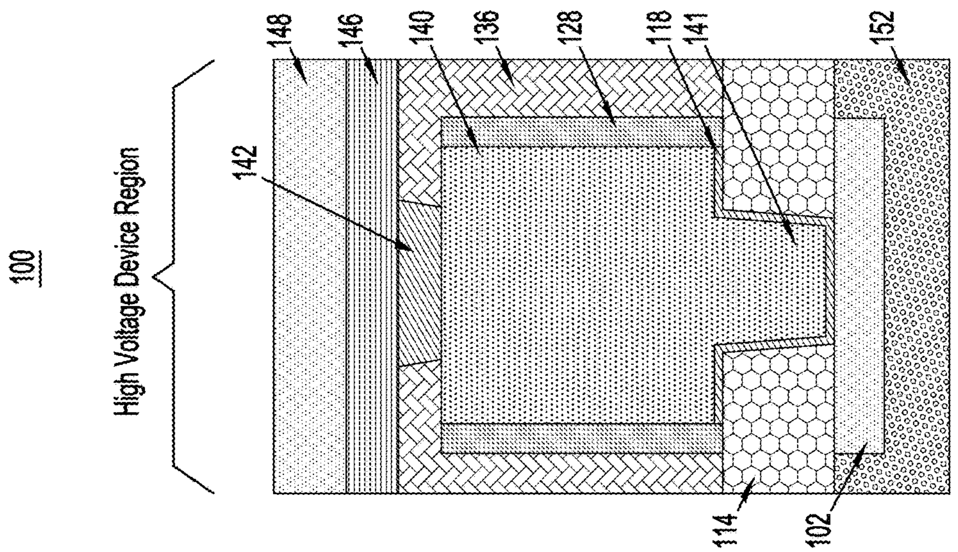
FIG. 16C is a cross-sectional view of the semiconductor structure showing the high voltage device region taken along the X2-X2 axis of FIG. 1A following removal of the mask layer and deposition of a backside ILD layer, according to an illustrative embodiment.
Figure 16B:
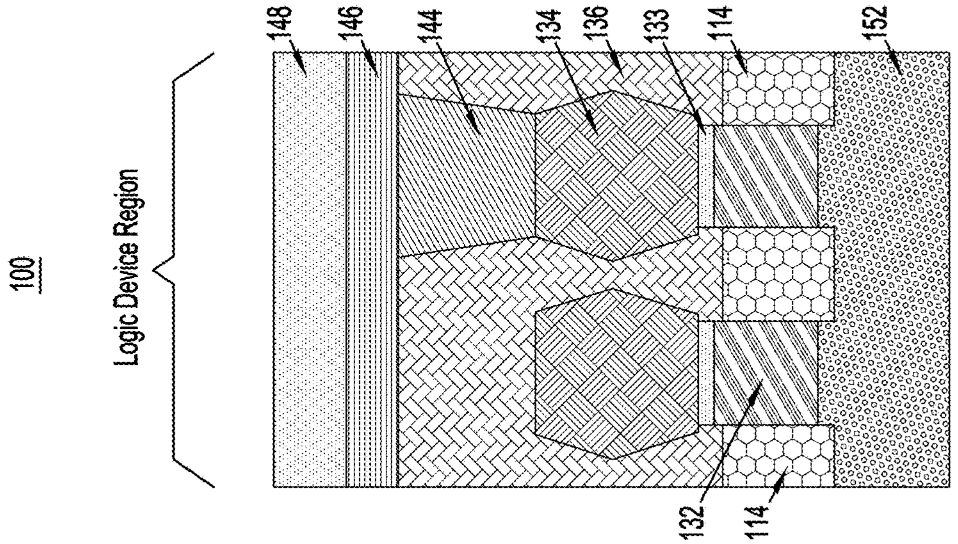
FIG. 16B is a cross-sectional view of the semiconductor structure showing the logic device region taken along the Y1-Y1 axis of FIG. 1A following removal of the mask layer and deposition of a backside ILD layer, according to an illustrative embodiment.
Figure 16A:
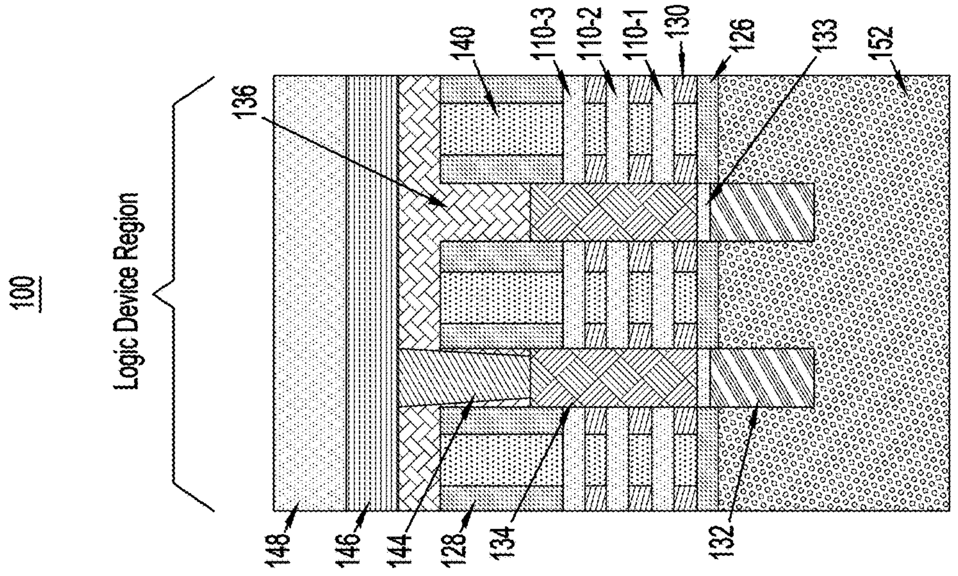
FIG. 16A is a cross-sectional view of the semiconductor structure showing the logic device region taken along the X1-X1 axis of FIG. 1A following removal of the mask layer and deposition of a backside ILD layer, according to an illustrative embodiment.

Referring now to FIGS. 16A-16C, the semiconductor structure 100 is shown following removal of the mask layer 150 and deposition of a backside ILD layer 152 according to an embodiment of the invention. The mask layer 150 in the high voltage device region shown in FIG. 16C is removed by, for example, an ash etching process. Next, the backside ILD layer 152 is deposited in the removed portions of substrate 102 in the logic device regions shown in FIGS. 16A and 16B and the removed mask layer 150 in the high voltage device region shown in FIG. 16C. The backside ILD layer 152 may be formed of similar processes and material as the ILD layer 136. Following formation of the backside ILD layer 152, any overfill can be removed by a planarization process such as CMP.

Figure 17C:
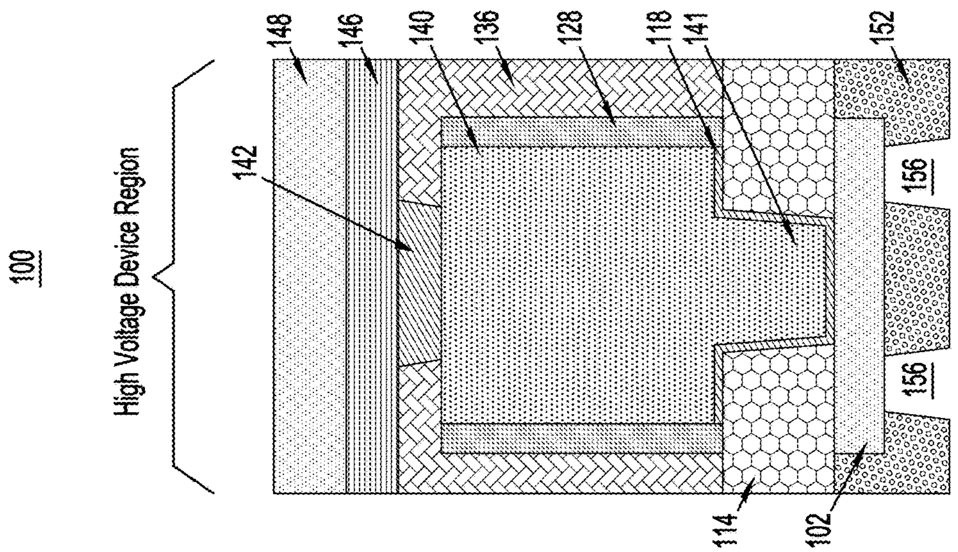
FIG. 17C is a cross-sectional view of the semiconductor structure showing the high voltage device region taken along the X2-X2 axis of FIG. 1A following the formation of backside middle-of-the-line contact openings, according to an illustrative embodiment.
Figure 17B:
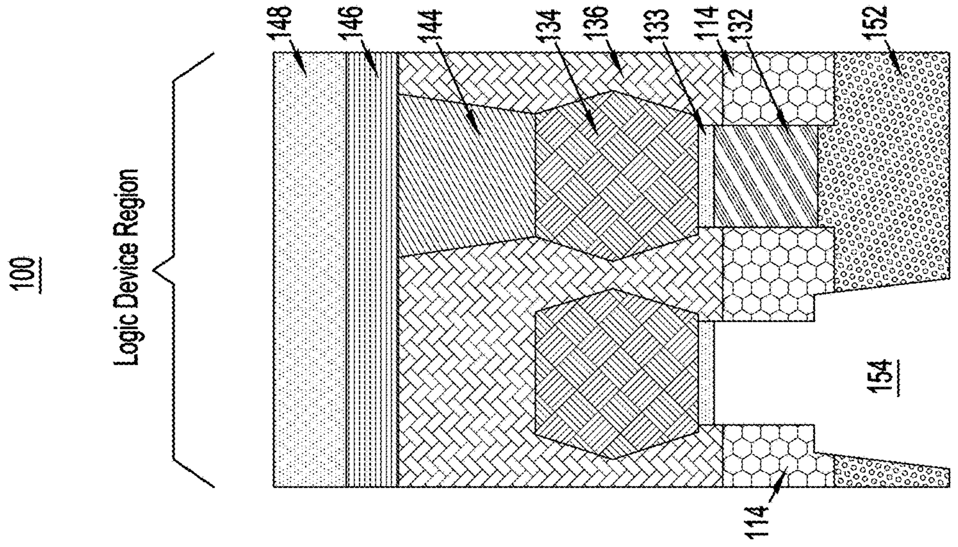
FIG. 17B is a cross-sectional view of the semiconductor structure showing the logic device region taken along the Y1-Y1 axis of FIG. 1A following the formation of backside middle-of-the-line contact openings, according to an illustrative embodiment.
Figure 17A:
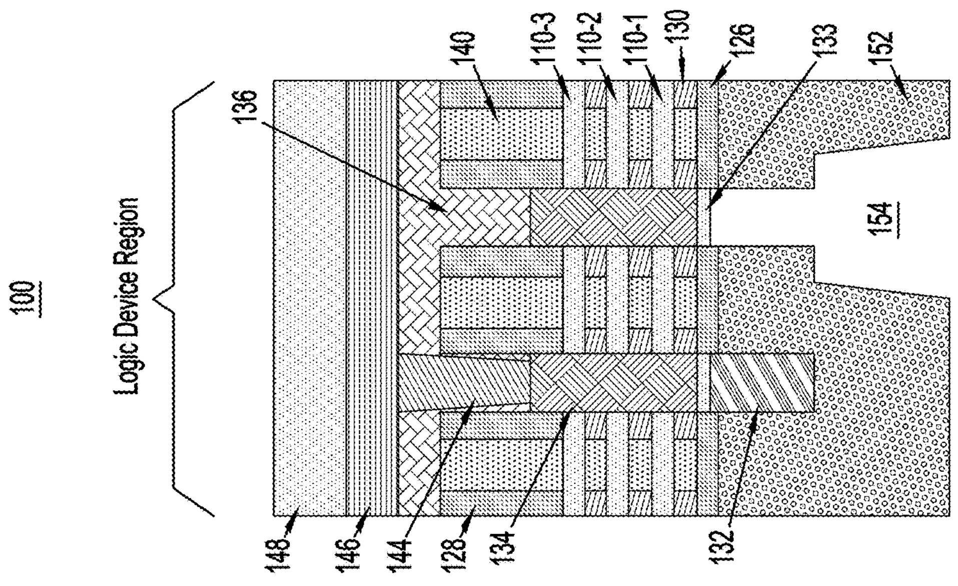
FIG. 17A is a cross-sectional view of the semiconductor structure showing the logic device region taken along the X1-X1 axis of FIG. 1A following the formation of backside middle-of-the-line contact openings, according to an illustrative embodiment.

Referring now to FIGS. 17A-17C, the semiconductor structure 100 is shown following the formation of backside middle-of-the-line contact openings 154 and backside middle-of-the-line contact openings 156 according to an embodiment of the invention. The backside middle-of-the-line contact openings 154 are formed in the logic device regions shown in FIGS. 17A and 17B, and the backside middle-of-the-line contact openings 156 are formed in the high voltage device region shown in FIG. 17C. In some embodiments, the backside middle-of-the-line contact openings 154 can be formed by first patterning and etching lines in the backside ILD layer 152 to expose one of sacrificial placeholders 132 in the logic device region using any suitable wet or dry etch, followed by removal of the exposed one of the sacrificial placeholders 132 to expose the buffer semiconductor layer 133 using any suitable etch processing that removes the material of the sacrificial placeholders 132 selective to that of the rest of the structure.

The backside middle-of-the-line contact openings 156 can be formed by first patterning and etching lines in the backside ILD layer 152 to expose the substrate 102 in the high voltage device region using any suitable wet or dry etch.

Figure 18C:
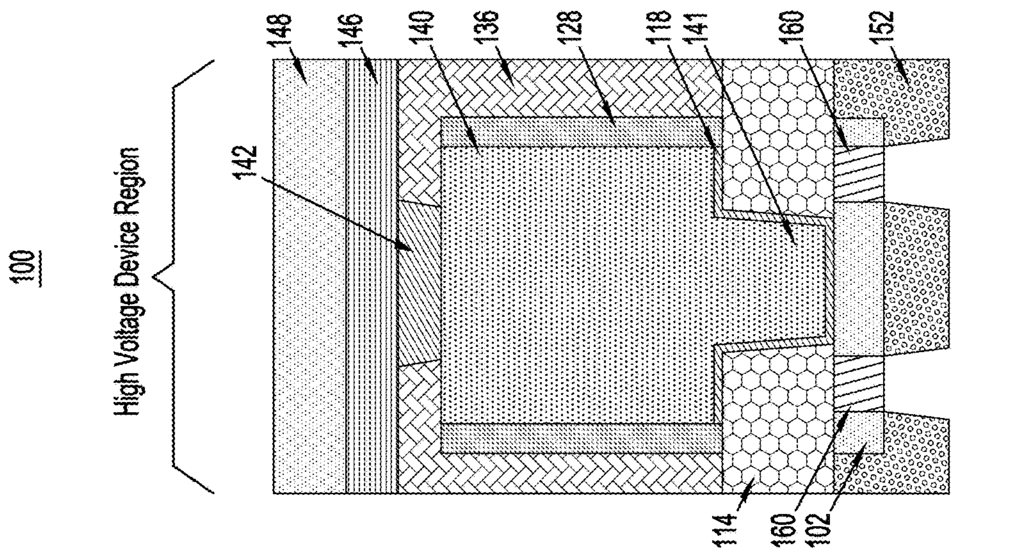
FIG. 18C is a cross-sectional view of the semiconductor structure showing the high voltage device region taken along the X2-X2 axis of FIG. 1A following deposition of a mask layer and formation of ion implanted backside source/drain regions, according to an illustrative embodiment.
Figure 18B:
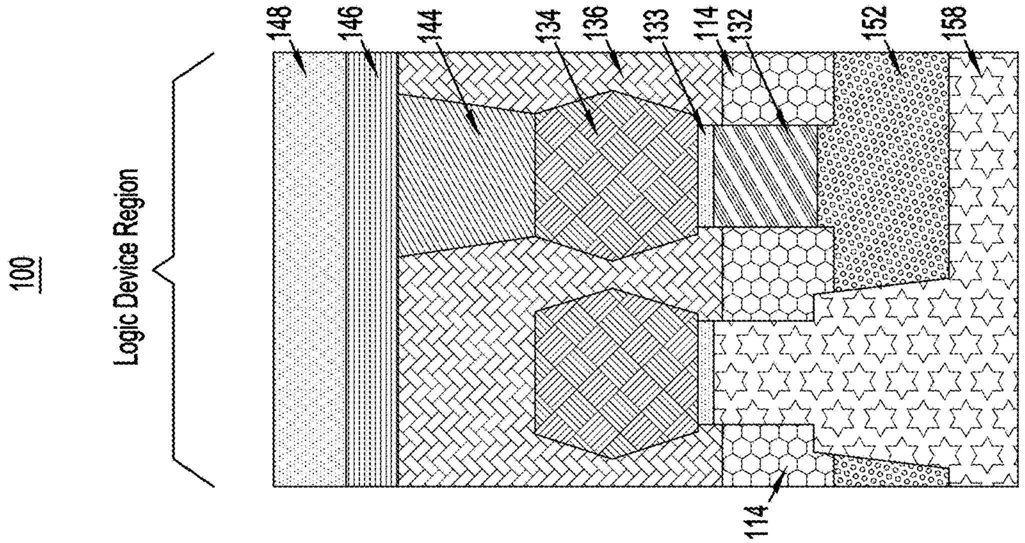
FIG. 18B is a cross-sectional view of the semiconductor structure showing the logic device region taken along the Y1-Y1 axis of FIG. 1A following deposition of a mask layer and formation of ion implanted backside source/drain regions, according to an illustrative embodiment.
Figure 18A:
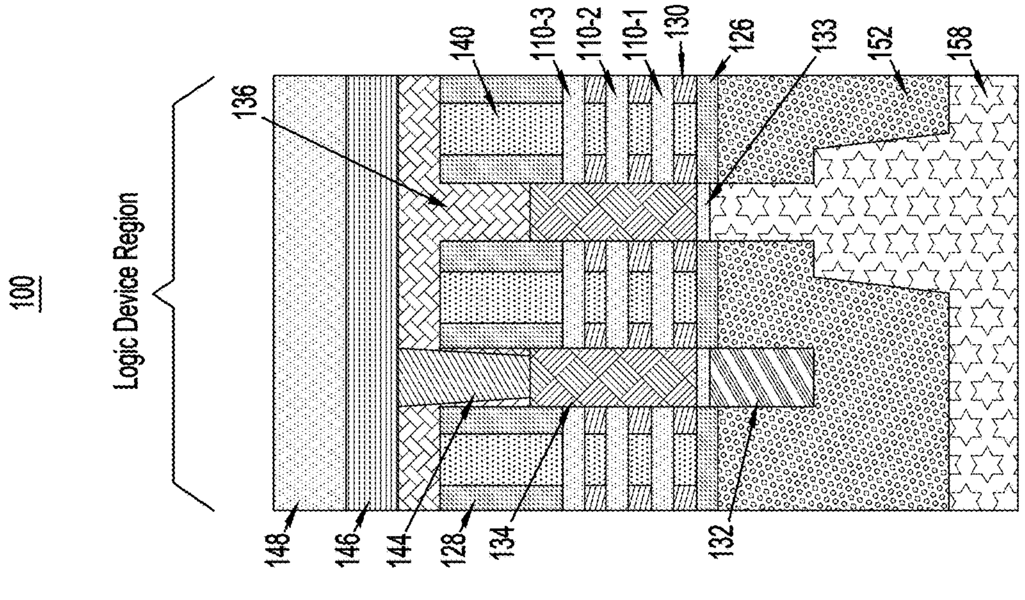
FIG. 18A is a cross-sectional view of the semiconductor structure showing the logic device region taken along the X1-X1 axis of FIG. 1A following deposition of a mask layer and formation of ion implanted backside source/drain regions, according to an illustrative embodiment.

Referring now to FIGS. 18A-18C, the semiconductor structure 100 is shown following deposition of a mask layer 158 and formation of ion implanted backside source/drain regions 160 in the substrate 102 according to an embodiment of the invention. The mask layer 158 is deposited in the backside middle-of-the-line contact openings 154 and on the backside ILD layer 152 in the logic device regions shown in FIGS. 18A and 18B. The mask layer 158 can be formed by similar processes and material as mask layer 116.

Next, the exposed substrate 102 in the backside middle-of-the-line contact openings 156 in the high voltage device region shown in FIG. 18C is subjected to an ion implantation technique to form the ion implanted backside source/drain regions 160. In some embodiments, the exposed substrate 102 is subjected to implantation of p-type ions (e.g., Be/F ions) such that the ion implanted backside source/drain regions 160 are ion implanted p-type backside source/drain regions. In some embodiments, the exposed substrate 102 is subjected to implantation of n-type ions (e.g., Si/F ions) such that the ion implanted backside source/drain regions 160 are ion implanted n-type backside source/drain regions. The high voltage device region in the backside of the substrate 102 results in a planar device as discussed below. By employing an ion implant technique, the top surfaces of the ion-implanted backside source/drain regions 160 are coplanar with the top surface of the substrate 102 thereby forming a device channel for the extra gate device, whereas when employing an epitaxial growth technique, the top surfaces of the source/drain regions 134 are not coplanar with the top surface of the topmost layer of the nanosheet channel layers 110.

Figure 19C:
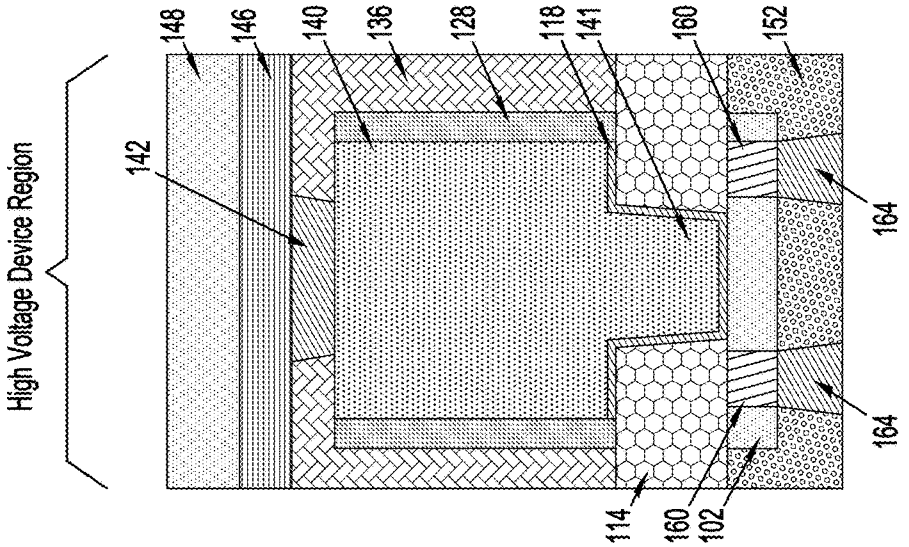
FIG. 19C is a cross-sectional view of the semiconductor structure showing the high voltage device region taken along the X2-X2 axis of FIG. 1A following the removal of the mask layer and the formation of backside middle-of-the-line contacts according to an illustrative embodiment.
Figure 19B:
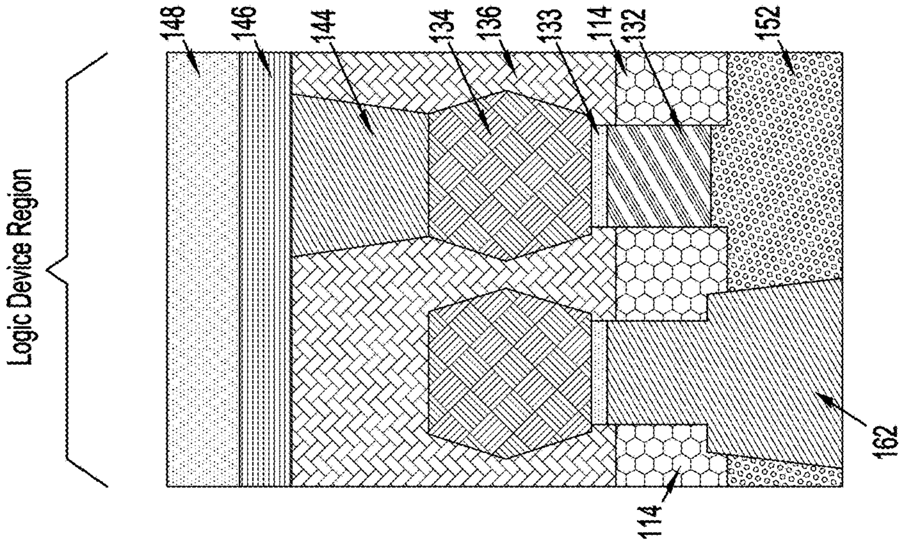
FIG. 19B is a cross-sectional view of the semiconductor structure showing the logic device region taken along the Y1-Y1 axis of FIG. 1A following the removal of the mask layer and the formation of backside middle-of-the-line contacts according to an illustrative embodiment.
Figure 19A:
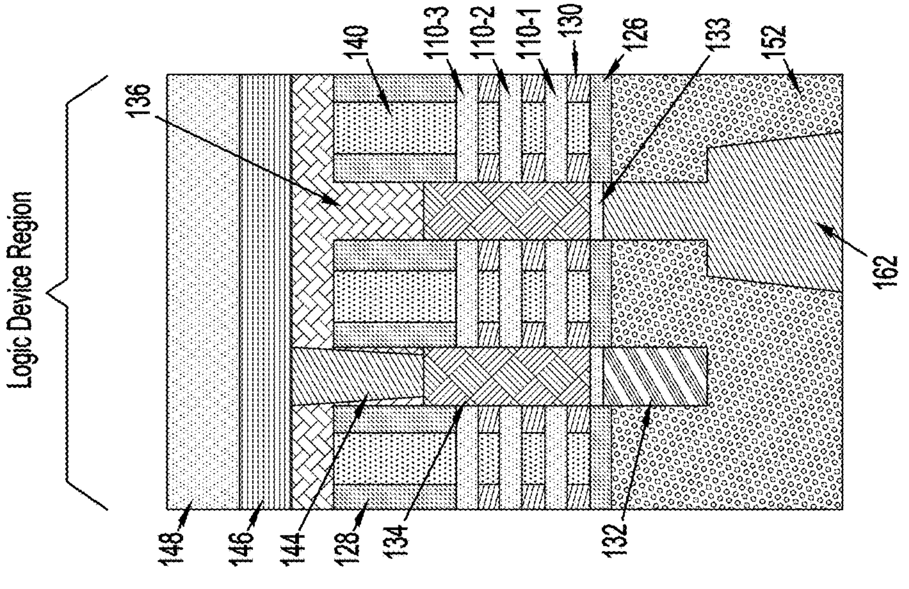
FIG. 19A is a cross-sectional view of the semiconductor structure showing the logic device region taken along the X1-X1 axis of FIG. 1A following the removal of the mask layer and the formation of backside middle-of-the-line contacts according to an illustrative embodiment.

Referring now to FIGS. 19A-19C, the semiconductor structure 100 is shown following the removal of the mask layer 158 and the formation of backside middle-of-the-line contacts 162 and 164 according to an embodiment of the invention. The mask layer 158 is removed in the logic device regions shown in FIGS. 19A and 19B by, for example, an ash etching process. Next, a suitable conductive metal is then deposited in the backside middle-of-the-line contact openings 154 (as shown in FIGS. 17A and 17B), and in the backside middle-of-the-line contact openings 156 (as shown in FIG. 17C), followed by CMP to remove any metal on top of the backside ILD layer 152 to form the backside middle-of-the-line contacts 162 and 164 (also referred to as backside source/drain contacts 162 and backside source/drain contacts 164). A suitable conductive metal can be deposited in a similar manner and of similar conductive metal as discussed above.

Figure 20A:
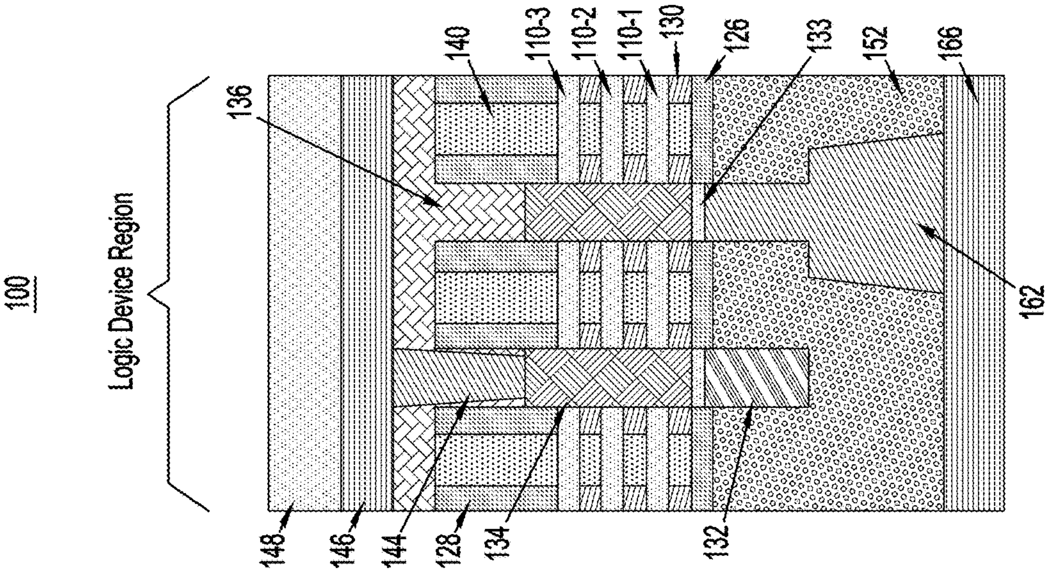
FIG. 20A is a cross-sectional view of the semiconductor structure showing the logic device region taken along the X1-X1 axis of FIG. 1A following the formation of a backside power delivery network, according to an illustrative embodiment.
Figure 20B:
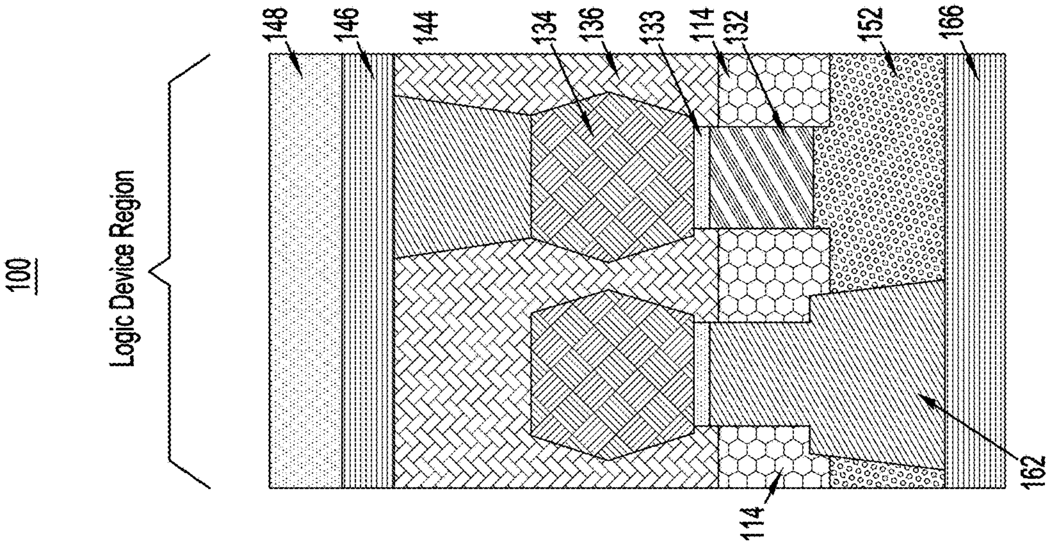
FIG. 20B is a cross-sectional view of the semiconductor structure showing the logic device region taken along the Y1-Y1 axis of FIG. 1A following the formation of a backside power delivery network, according to an illustrative embodiment.
Figure 20C:
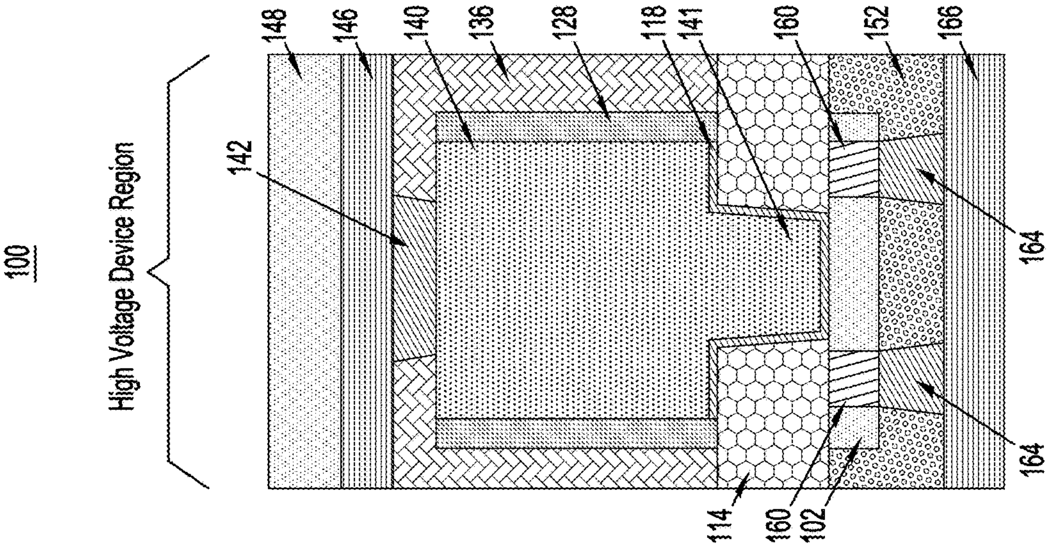
FIG. 20C is a cross-sectional view of the semiconductor structure showing the high voltage device region taken along the X2-X2 axis of FIG. 1A following the formation of a backside power delivery network, according to an illustrative embodiment.

Referring now to FIGS. 20A-20C, the semiconductor structure 100 is shown following the formation of a backside power delivery network 166 according to an embodiment of the invention. The backside power delivery network 166 is formed over the structure including the backside middle-of-the-line contacts 162 and 164 and is based on creation of a wiring scheme that is disposed on both sides of the device layer (front end of line structure). In illustrative embodiments, the logic device region can be co-integrated with the high voltage device region through the backside power delivery network 166.

Accordingly, in an illustrative embodiment, the semiconductor structure 100 will include a logic device region comprising a transistor device and a high voltage device region comprising a planar device. The transistor device includes at least the nanosheet channel layers 110, the replacement gate structure 140, the source/drain regions 134 and one of the backside source/drain contacts 162 connecting one of the source/drain regions 134 to the backside power delivery network 166. The planar device includes at least the substrate 102 disposed in the backside ILD layer 152 and having the ion-implanted backside source/drain regions 160 each disposed within the backside of the substrate 102, and the backside source/drain contacts 164 connecting the ion implanted backside source/drain regions 160 to the backside power delivery network 166.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

According to an aspect of the invention, a semiconductor structure comprises a first backside source/drain region and a second backside source/drain region in a substrate, associated with an extra gate device, disposed within a backside region of the semiconductor structure.

In embodiments, the semiconductor structure further comprises a first backside source/drain contact connecting the first backside source/drain region to a backside power delivery network, and a second backside source/drain contact connecting the second backside source/drain region to the backside power delivery network.

In embodiments, the first backside source/drain region and the second backside source/drain region comprise an ion-implanted first backside source/drain region and an ion-implanted second backside source/drain region.

In embodiments, the first backside source/drain region and the second backside source/drain region in the substrate is a planar device.

In embodiments, the extra gate device is co-integrated with a logic device.

In embodiments, the extra gate device is co-integrated with a logic device, where the logic device comprises a frontside source/drain region connected to the backside power delivery network by a third backside source/drain contact.

In embodiments, the logic device further comprises a plurality of nanosheet channel layers disposed on opposite sidewalls of the frontside source/drain region.

According to an aspect of the invention, a semiconductor structure comprises a gate extension extending from a gate region, associated with an extra gate device, within a frontside of the semiconductor structure. The gate extension is disposed between opposing sidewalls of a first shallow trench region and a second shallow trench region disposed on a substrate. A gate dielectric layer is disposed between the gate extension and a top surface of the substrate.

In embodiments, the semiconductor structure further comprises a middle-of-the-line contact connecting the gate region to a back-end-of-the-line interconnect.

In embodiments, the gate region and the gate extension comprise a same conductive material.

In embodiments, the gate dielectric layer is further disposed between the gate extension and the first shallow trench region and the second shallow trench region and on a portion of the top surfaces of the first shallow trench region and the second shallow trench region under the gate region.

In embodiments, the semiconductor structure further comprises a first backside source/drain region and a second backside source/drain region in the substrate, associated with the extra gate device, disposed within a backside region of the semiconductor structure.

In embodiments, the semiconductor structure further comprises a first backside source/drain contact connecting the first backside source/drain region to a backside power delivery network, and a second backside source/drain contact connecting the second backside source/drain region to the backside power delivery network.

In embodiments, the first backside source/drain region and the second backside source/drain region comprise an ion-implanted first backside source/drain region and an ion-implanted second backside source/drain region.

In embodiments, the extra gate device is co-integrated with a logic device, the logic device being in the frontside region of the semiconductor structure and comprising a frontside source/drain region connected to a backside power delivery network by a backside source/drain contact.

According to an aspect of the invention, a semiconductor structure comprises an extra gate device disposed within a backside region of the semiconductor structure, and comprising a first ion-implanted backside source/drain region and a second ion-implanted backside source/drain region within a substrate, and a logic device, disposed within a frontside region of the semiconductor structure and comprising a first stack of nanosheet channel layers and a second stack of nanosheet channel layers adjacent to the first stack of nanosheet channel layers, and an epitaxial grown source/drain region between the first stack of nanosheet channel layers and the second stack of nanosheet channel layers. The extra gate device is co-integrated with the logic device.

In embodiments, a top surface of each of the first ion-implanted backside source/drain region and the second ion-implanted backside source/drain region is coplanar with a top surface of the substrate, and wherein a top surface of the epitaxial grown source/drain region is above a top surface of each of the first stack of nanosheet channel layers and the second stack of nanosheet channel layers.

In embodiments, the semiconductor structure further comprises a first backside source/drain contact connecting the first ion-implanted backside source/drain region to a backside power delivery network, and a second backside source/drain contact connecting the second ion-implanted backside source/drain region to the backside power delivery network.

In embodiments, the epitaxial grown source/drain region is connected to the backside power delivery network by a third backside source/drain contact.

According to an aspect of the invention, an integrated circuit comprises one or more semiconductor structures, wherein at least one of the one or more semiconductor structures comprises a first backside source/drain region and a second backside source/drain region in a substrate, associated with an extra gate device, disposed within a backside region of the semiconductor structure.

In embodiments, the at least one of the one or more semiconductor structures further comprises a first backside source/drain contact connecting the first backside source/drain region to a backside power delivery network, and a second backside source/drain contact connecting the second backside source/drain region to the backside power delivery network.

In embodiments, the extra gate device is co-integrated with a logic device, the logic device region comprising a frontside source/drain region connected to the backside power delivery network by a third backside source/drain contact.

In embodiments, the at least one of the one or more semiconductor structures further comprises a gate extension extending from a gate region, associated with the extra gate device, within a frontside of the semiconductor structure, wherein the gate extension is disposed between opposing sidewalls of a first shallow trench region and a second shallow trench region disposed on the substrate, and wherein a gate dielectric layer is disposed between the gate extension and a top surface of the substrate.

According to an aspect of the invention, a method comprises ion implanting a first backside source/drain region and a second backside source/drain region in a substrate, associated with an extra gate device, disposed within a backside region of a semiconductor structure.

In embodiments, the method further comprises forming a first backside source/drain contact on the first backside source/drain region, forming a second backside source/drain contact on the second backside source/drain region, and forming a backside power delivery network on the first backside source/drain contact and the second backside source/drain contact.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:

a first backside source/drain region and a second backside source/drain region in a substrate, associated with an extra gate device, disposed within a backside region of the substrate;

wherein the extra gate device is co-integrated with a logic device, the logic device comprising a frontside source/ drain region connected to a backside power delivery network by a third backside source/drain contact.

2. The semiconductor structure according to claim 1, further comprising a first backside source/drain contact connecting the first backside source/drain region to a backside power delivery network, and a second backside source/drain contact connecting the second backside source/drain region to the backside power delivery network.

3. The semiconductor structure according to claim 1, wherein the first backside source/drain region and the second backside source/drain region comprise an ion-implanted first backside source/drain region and an ion-implanted second backside source/drain region.

4. The semiconductor structure according to claim 1, wherein the first backside source/drain region and the second backside source/drain region in the substrate is a planar device.

5. The semiconductor structure according to claim 1, wherein the logic device further comprises a plurality of nanosheet channel layers disposed on opposite sidewalls of the frontside source/drain region.

6. A semiconductor structure, comprising:

a gate extension extending from a gate region, associated with an extra gate device, within a frontside of the semiconductor structure;

wherein the gate extension is disposed between opposing sidewalls of a first shallow trench region and a second shallow trench region disposed on a substrate;

wherein a gate dielectric layer is disposed between the gate extension and a top surface of the substrate; and wherein the gate dielectric layer is further disposed between the gate extension and the first shallow trench region and the second shallow trench region and on a portion of top surfaces of the first shallow trench region and the second shallow trench region under the gate region.

7. The semiconductor structure according to claim 6, further comprising a middle-of-the-line contact connecting the gate region to a back-end-of-the-line interconnect.

8. The semiconductor structure according to claim 6, wherein the gate region and the gate extension comprise a same conductive material.

9. The semiconductor structure according to claim 6, further comprising a first backside source/drain region and a second backside source/drain region in the substrate, associated with the extra gate device, disposed within a backside region of the semiconductor structure.

10. The semiconductor structure according to claim 9, further comprising a first backside source/drain contact connecting the first backside source/drain region to a backside power delivery network, and a second backside source/drain contact connecting the second backside source/drain region to the backside power delivery network.

11. The semiconductor structure according to claim 9, wherein the first backside source/drain region and the second backside source/drain region comprise an ion-implanted first backside source/drain region and an ion-implanted second backside source/drain region.

12. A semiconductor structure comprising:

a gate extension extending from a gate region, associated with an extra gate device, within a frontside of the semiconductor structure;

wherein the gate extension is disposed between opposing sidewalls of a first shallow trench region and a second shallow trench region disposed on a substrate;

wherein a gate dielectric layer is disposed between the gate extension and a top surface of the substrate; and wherein the extra gate device is co-integrated with a logic device, the logic device being in a frontside region of the semiconductor structure and comprising a frontside source/drain region connected to a backside power delivery network by a backside source/drain contact.

13. A semiconductor structure, comprising:

an extra gate device disposed within a backside region of a substrate, and comprising a first ion-implanted backside source/drain region and a second ion-implanted backside source/drain region within the substrate; and a logic device, disposed within a frontside region of the semiconductor structure and comprising a first stack of nanosheet channel layers and a second stack of nanosheet channel layers adjacent to the first stack of nanosheet channel layers; and an epitaxial grown source/drain region between the first stack of nanosheet channel layers and the second stack of nanosheet channel layers;

wherein the extra gate device is co-integrated with the logic device.

14. The semiconductor structure according to claim 13, wherein a top surface of each of the first ion-implanted backside source/drain region and the second ion-implanted backside source/drain region is coplanar with a top surface of the substrate, and wherein a top surface of the epitaxial grown source/drain region is above a top surface of each of the first stack of nanosheet channel layers and the second stack of nanosheet channel layers.

15. The semiconductor structure according to claim 13, further comprising a first backside source/drain contact connecting the first ion-implanted backside source/drain region to a backside power delivery network, and a second backside source/drain contact connecting the second ion-implanted backside source/drain region to the backside power delivery network.

16. The semiconductor structure according to claim 15, wherein the epitaxial grown source/drain region is connected to the backside power delivery network by a third backside source/drain contact.

17. An integrated circuit, comprising:

one or more semiconductor structures, wherein at least one of the one or more semiconductor structures comprises:

a first backside source/drain region and a second backside source/drain region in a substrate, associated with an extra gate device, disposed within a backside region of the substrate;

wherein the extra gate device is co-integrated with a logic device, the logic device comprising a frontside source/drain region connected to a backside power delivery network by a third backside source/drain contact.

18. The integrated circuit according to claim 17, wherein the at least one of the one or more semiconductor structures further comprises a first backside source/drain contact connecting the first backside source/drain region to a backside power delivery network, and a second backside source/drain contact connecting the second backside source/drain region to the backside power delivery network.

19. The integrated circuit according to claim 17, the at least one of the one or more semiconductor structures further comprises:

a gate extension extending from a gate region, associated with the extra gate device, within a frontside of the substrate;

wherein the gate extension is disposed between opposing sidewalls of a first shallow trench region and a second shallow trench region disposed on the substrate; and wherein a gate dielectric layer is disposed between the gate extension and a top surface of the substrate.

* * * * *